(12) United States Patent
Kamenov et al.

(10) Patent No.: US 7,239,450 B2
(45) Date of Patent: Jul. 3, 2007

(54) METHOD OF DETERMINING LENS MATERIALS FOR A PROJECTION EXPOSURE APPARATUS

(75) Inventors: Vladimir Kamenov, Essingen (DE); Daniel Kraehmer, Aalen (DE); Michael Totzeck, Schwaebisch Gmuend (DE); Toralf Gruner, Aalen-Hofen (DE); Aurelian Dodoc, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/181,694

(22) Filed: Jul. 14, 2005

(65) Prior Publication Data

US 2006/0109560 A1 May 25, 2006

Related U.S. Application Data

(60) Provisional application No. 60/630,168, filed on Nov. 22, 2004.

(51) Int. Cl.
G02B 3/00 (2006.01)

(52) U.S. Cl. ........................ 359/642; 359/649; 359/896

(58) Field of Classification Search ................ 359/642, 359/649, 650, 651, 896
See application file for complete search history.

(56) References Cited

U.S. PATENT DOCUMENTS

| | | | |
|---|---|---|---|
| 6,201,634 B1 | 3/2001 | Sakuma et al. | 359/322 |
| 6,806,942 B2 * | 10/2004 | Schuster et al. | 355/67 |
| 2003/0000453 A1 | 1/2003 | Unno et al. | 117/1 |
| 2003/0011183 A1 | 1/2003 | Freist et al. | 280/770 |
| 2003/0011893 A1 | 1/2003 | Shiraishi et al. | |
| 2003/0011896 A1 | 1/2003 | Shiraishi | 359/754 |
| 2003/0025894 A1 | 2/2003 | Owa et al. | 355/67 |
| 2003/0058421 A1 | 3/2003 | Omura et al. | 355/53 |
| 2003/0137733 A1 | 7/2003 | Gerhard et al. | 359/494 |
| 2003/0197946 A1 | 10/2003 | Omura | 359/649 |
| 2003/0234981 A1 | 12/2003 | Hoffman et al. | 359/498 |
| 2004/0105170 A1 | 6/2004 | Krahmer et al. | 359/726 |
| 2005/0146798 A1 | 7/2005 | Kraehmer et al. | 359/650 |
| 2005/0190435 A1 | 9/2005 | Shafer et al. | |

FOREIGN PATENT DOCUMENTS

| | | |
|---|---|---|
| WO | WO2003/036361 | 5/2003 |
| WO | WO2003/046634 | 6/2003 |
| WO | WO2004/023184 A1 | 3/2004 |
| WO | WO2004/111690 | 12/2004 |

* cited by examiner

*Primary Examiner*—Scott J. Sugarman
*Assistant Examiner*—Darryl J. Collins
(74) *Attorney, Agent, or Firm*—Fish & Richardson P.C.

(57) ABSTRACT

A method of determining materials of lenses contained in an optical system of a projection exposure apparatus is described. First, for each lens of a plurality of the lenses, a susceptibility factor $K_{LT/LH}$ is determined. This factor is a measure of the susceptibility of the respective lens to deteriorations caused by at least one of lifetime effects and lens heating effects. Then a birefringent fluoride crystal is selected as a material for each lens for which the susceptibility factor $K_{LT/LH}$ is above a predetermined threshold. Theses lenses are assigned to a first set of lenses. For these lenses, measures are determined for reducing adverse effects caused by birefringence inherent to the fluoride crystals.

48 Claims, 9 Drawing Sheets

METHOD OF DETERMINING LENS MATERIALS FOR A PROJECTION EXPOSURE APPARATUS

CROSS-REFERENCE TO RELATED APPLICATIONS

This application claims priority of provisional U.S. patent application Ser. No. 60/630,168, filed Nov. 22, 2004, whose full disclosure is incorporated herein by reference.

BACKGROUND OF THE INVENTION

1. Field of the Invention

The present invention generally relates to projection exposure apparatuses used in the fabrication of microstructured devices. More particularly, the invention relates to a method of determining which lenses should be made of fluoride crystals such as calcium fluoride ($CaF_2$), and which measures can be taken against adverse effects caused by intrinsic birefringence.

2. Description of Related Art

Projection exposure apparatuses are commonly used in the fabrication of electrical and optical integrated circuits for forming images of device patterns on semiconductor substrates. More particularly, the process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, a pattern is formed on the photoresist using a projection exposure apparatus, such as a step-and-scan tool.

A projection exposure apparatus typically includes an illumination system, a mask alignment stage, a projection objective and a wafer alignment stage for aligning the wafer coated with the photoresist. A mask (also referred to as a reticle) containing a pattern to be formed on the photoresist is illuminated by the illumination system. During exposure, the projection objective forms an image of the mask onto the photoresist. After developing the photoresist, an etch process transfers the pattern into a patterned thin film stack on the wafer. Finally, the photoresist is removed.

Since the resolving power of the projection objective is inversely proportional to the exposure wavelength, new generations of such tools generally use exposure light with a shorter wavelength than used by tools of the previous generation. At present, deep ultraviolet light having a wavelength of 248 nm or 193 nm is used for submicron lithography. The next generation of photolithography tools will use exposure light having a wavelength of 157 nm.

One of the major problems encountered when using exposure light having such short wavelengths is the fact that conventional lens materials such as quartz glasses are not sufficiently transparent in the deep ultraviolet wavelength domain. A low transparency reduces the brightness of the image and results in increased heating of the lenses. Lens heating, in turn, often causes undesired variations of the shape of the lenses and also of their index of refraction. Apart from that, DUV projection light frequently interacts with quartz glasses such that their density and thus their index of refraction are altered irreversibly.

For that reason, other materials have been investigated that do not suffer from the deficiencies described above. Among the most promising materials that can replace conventional lens materials is a class of single crystal fluoride materials that have, for the wavelengths of interest, much higher transmittances than conventional lens materials. Thus far, calcium fluoride ($CaF_2$) seems to be the most promising candidate within this material class; other cubic crystals belonging to that class include barium fluoride ($BaF_2$), lithium fluoride ($LiF_2$), strontium fluoride ($SrF_2$) and isomorphous mixtures such as $Ca_{1-x}Ba_xF_2$.

Of prime concern for the use of these cubic crystalline materials for optical elements in deep ultraviolet lithography tools is their inherent anisotropy of the refractive index. This inherent anisotropy is commonly referred to as "intrinsic birefringence". Since the intrinsic birefringence scales approximately as the inverse of the wavelength of light, the issue of birefringence becomes particularly significant if the exposure wavelength is below 200 nm.

In birefringent materials, the refractive index varies as a function of the orientation of the material with respect to the direction of incident light and also of its polarization. As a result, unpolarized light propagating through a birefringent material will generally separate into two beams having orthogonal polarization states. When light passes through a unit length of a birefringent material, the difference in refractive index for the two ray paths will result in an optical path difference or retardance. The retardance causes wavefront aberrations that are usually referred to as "retardance aberrations". These aberrations are capable of significantly degrading image resolution and introducing distortion of the image.

One of the most interesting approaches for addressing the problem of retardance aberrations is to combine several cubic crystals whose crystal lattices are oriented with respect to each other in such a way that the overall retardance is reduced by mutual compensation. The underlying idea is to exploit the fact that, if a first polarization state is retarded in one crystal, a second polarization state being orthogonal to the first one may be retarded in another crystal of the optical system. As a result, the retarded wavefront of the first polarization state may "catch up" with the wavefront of the second polarization state while the latter is retarded in the other crystal. The overall net retardance of both crystals, i.e. the difference between both retardances imposed on the different polarization states, may then be considerably reduced or even made to vanish.

In U.S. Pat. No. 2004/0105170 A1 an optical system is described comprising two groups each including two lenses that are made of cubic crystals. In one group, two crystals are oriented such that each [111] crystal axis (or an equivalent crystal axis such as the [11-1] axis, for example) coincides with the optical axis that is defined as the symmetry axis of the optical system. The orientations of the crystal lattices of both crystals differ in that the crystal lattice of one of the crystals results from rotating the crystal lattice of the other crystal around is the optical axis by 60°. As a result of this rotation that is sometimes referred to as "clocking", the rotational asymmetry of birefringence inherent to each single crystal is substantially reduced if taking the group as a whole.

Within the other group, the two lenses are made of crystals whose crystal lattices are oriented such that each [100] crystal axis coincides with the optical axis of the optical system. Again, the crystal lattices are rotated around the optical axis, but in this case by only 45°. Also in this group the birefringences of both crystals combine such that the overall birefringence of the group is almost rotational symmetrical.

However, since the birefringences induced in both lens groups have different signs, different polarization states are retarded in each group. This opens the way for mutually compensating the effects of birefringence induced in both lens groups. Since the birefringence in both lens groups not only differs in sign, but approximately equals in magnitude, the overall retardance can be significantly reduced if both polarization states travel in the same direction and with the same path lengths within each crystal.

Often the design objective is not (or not exclusively) the reduction of overall retardance, but to positively affect the retardance or its angular pupil distribution for achieving other advantageous effects. For example, in many cases it is more desirable to have a particular symmetric angular retardance distribution than to achieve a minimum mean retardance. Therefore the optimum crystal lattice orientations depend on the specific design objective.

Unfortunately, the path lengths and directions of the rays through the lenses cannot be varied just at it would be required for achieving the desired retardance property. This is because the shape of the lenses, their arrangement within the optical system and thus also the optical paths taken by light rays when propagating through the lenses are almost completely determined by the design of the optical system as a whole in view of the imaging properties that are to be achieved.

Until now, more or less heuristic approaches have been followed when it was to determine which lenses should be made of a fluoride crystal and, if there are any such lenses, which measures can be taken in order to achieve tolerable aberrations caused by intrinsic birefringence.

SUMMARY OF THE INVENTION

It is a first object of the present invention to provide a design method that allows to reduce the quantity of expensive fluoride crystals needed as lens material without accepting intolerable aberrations.

It is a further object of the present invention to provide a design method that allows to optimize the use of fluoride crystals if the number of available crystals is limited for cost or other reasons.

The first object is achieved by a method comprising the steps of:
a) determining, for each lens of a plurality of the lenses, a susceptibility factor $K_{LT/LH}$ that is a measure of the susceptibility of the respective lens to deteriorations caused by at least one of lifetime effects and lens heating effects;
b) selecting a birefringent fluoride crystal as a material for each lens for which the susceptibility factor $K_{LT/LH}$ is above a predetermined threshold;
c) defining a first set of lenses comprising only lenses for which the susceptibility factor $K_{LT/LH}$ is above a predetermined threshold;
d) determining measures for reducing adverse effects caused by birefringence inherent to the lenses of the first set of lenses.

Although it has been known in the art as such to use fluoride crystals to avoid degradations due to lifetime and/or lens heating effects, and to orient crystal lattices in such a way so as to minimize disturbances caused by intrinsic birefringence, the new method allows to do this much more efficiently than before. Optical systems designed according to the new method therefore have excellent lifetime stability, low aberrations caused by intrinsic birefringence and are less expensive because only those elements are made of fluoride crystals that are essential for achieving the aforementioned properties. Thus the invention allows to design optical systems for projection exposure apparatuses in which the quantity of expensive fluoride crystals needed as lens material reaches a minimum value.

However, there may be situations in which even this minimum quantity of fluoride crystals is not available or shall not be used for cost reasons. If the quantity of fluoride crystals that can be used is limited, a method comprising the following steps may be used:
a) determining, for each lens of a plurality of the lenses, a susceptibility factor $K_{LT/LH}$ that is a measure of the susceptibility of the respective lens to deteriorations caused by at least one of lifetime effects and lens heating effects;
b) providing a predetermined quantity of fluoride crystals;
c) sorting the lenses in the order of the susceptibility factor $K_{LT/LH}$;
d) selecting a birefringent fluoride crystal as a material for k lenses having the highest susceptibility factor $K_{LT/LH}$, wherein k is selected such that for a lens k+1, which follows the lens k in the order of the susceptibility factor, the remaining quantity of fluoride crystals is not sufficient;
e) defining a first set of lenses comprising the k lenses;
f) determining measures for reducing adverse effects caused by birefringence inherent to the lenses of the first set of lenses.

It should be noted that the term "lens" in this context is to be understood in a broad sense. In particular, the term "lens" shall include conventional refractive lenses with spherical, aspherical of free-form surfaces, Fresnel lenses, plates having parallel faces and other refractive optical elements such as micro-lens arrays.

In the following, a fluoride crystal material is referred to as a (xyz) material if the [xyz] crystal axis is aligned along the optical axis of the optical system. (xyz) may be (100), (110) or (111). It is further to be understood that in the present context all references to a particular crystal axis such as the [110] crystal axis are meant to include all crystal axes that are equivalent to this particular crystal axis. For the [110] crystal axis, for example, the crystal axes [−110], [1-10], [−1-10], [101], [10-1], [−101], [1-0-1], [011], [0-11], [01-1] and [0-1-1] are equivalent.

The term "optical path length difference" or retardance is defined as the difference between the optical paths of two light rays propagating in the same direction and having orthogonal (usually linear) polarization states.

The term "birefringence" is defined as the retardance divided by the geometrical path length. Values are given in units of nm/cm. In a more specific sense, birefringence is a tensor that also contains information about the direction of the polarization of the longer optical path.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
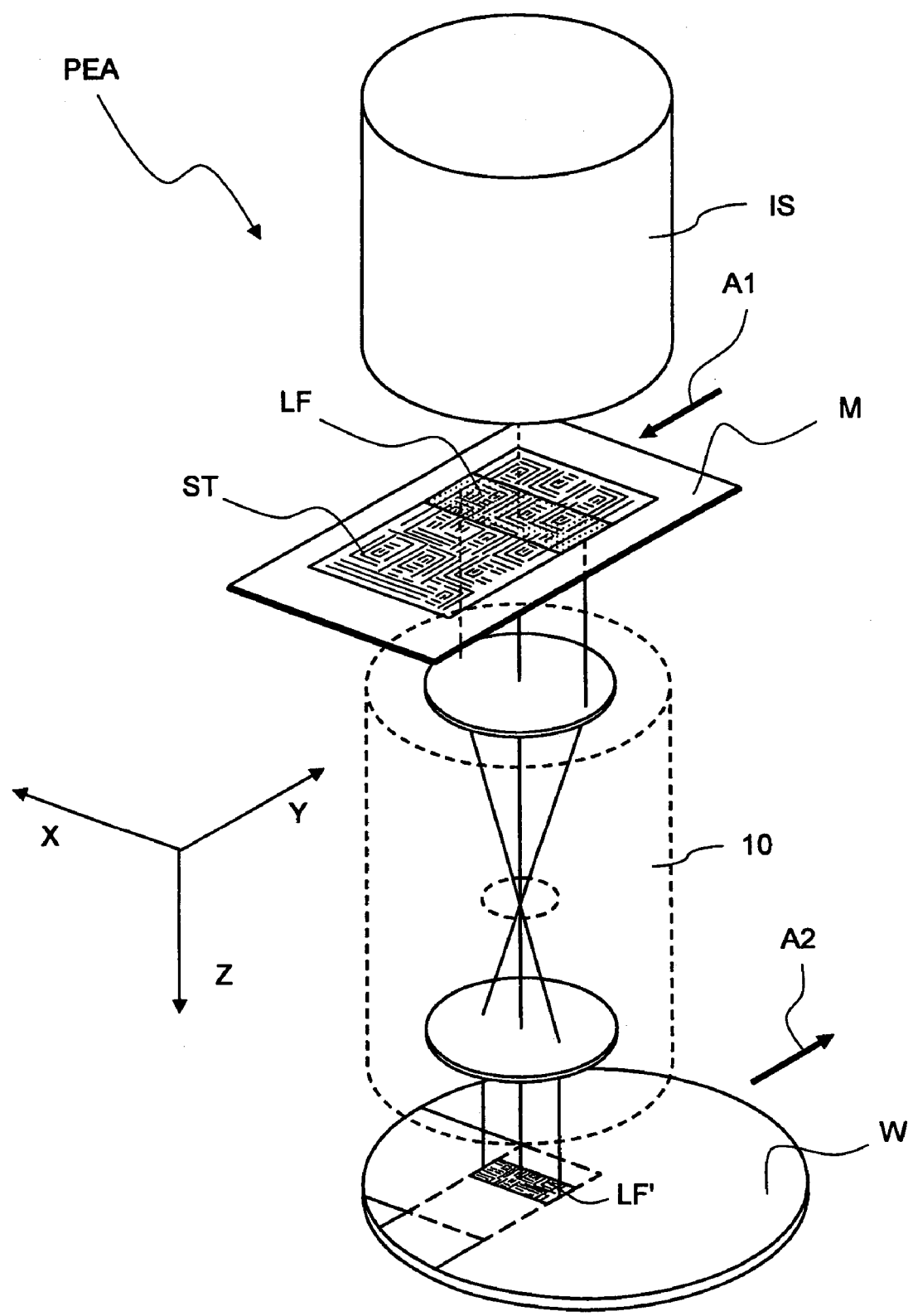
FIG. 1 is a perspective and highly simplified view of an exemplary projection exposure apparatus comprising a projection objective.

FIG. 1 shows a perspective and highly simplified view of an exemplary projection exposure apparatus. The projection exposure apparatus, which is denoted in its entirety by PEA, comprises an illumination system IS that produces a projection light bundle. The projection light bundle illuminates, in the embodiment shown, a narrow rectangular light field LF on a mask M containing minute structures ST. The structures ST within the light field LF are imaged onto a light sensitive layer, for example a photoresist, which is deposited on a substrate. The substrate, which is realized in this embodiment as a silicon wafer W, is arranged on a stage in an image plane of a projection objective 10. The projection objective 10 usually comprises a plurality of lenses and often also several plane or curved mirrors. Since the projection objective 10 has a magnification of less than 1, a minified image LF' of the structures ST within the light field LF is projected onto the wafer W.

During the projection, the mask M and the wafer W are moved along a scan direction along the Y-axis. The ratio between the velocities of the mask M and the wafer W is equal to the magnification of the projection objective PL. If the projection objective 10 inverts the image, the mask M and the wafer W move in opposite directions, as this is indicated in FIG. 1 by arrows A1 and A2. Thus the light field LF scans over the mask M so that also larger structured areas on the mask M can be projected continuously onto the photoresist. Such a type of projection exposure apparatus is often referred to as "scanner". However, the present invention may also be applied to projection exposure apparatuses of the "stepper" type in which there is no movement of the mask and the wafer during the projection.

Figure 2:
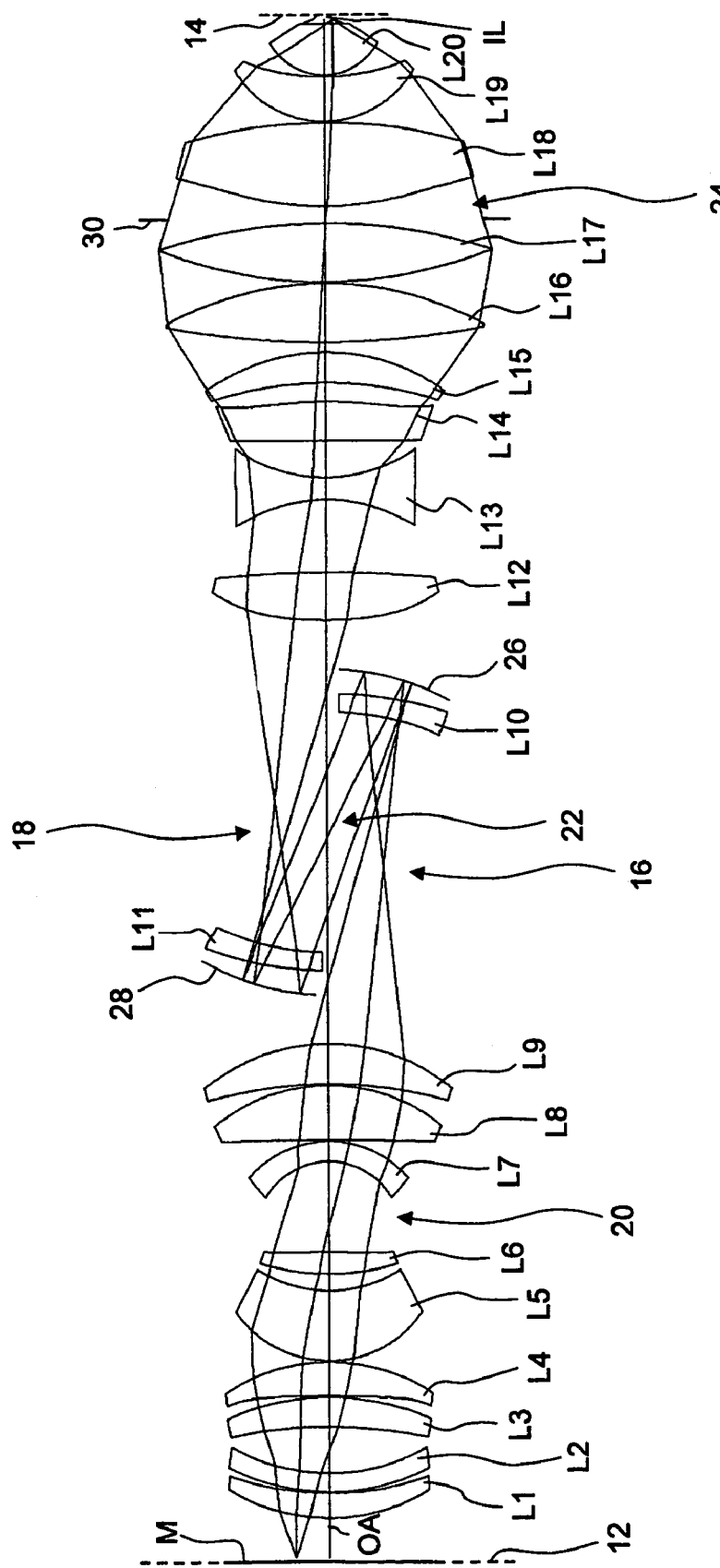
FIG. 2 shows a meridional section of the projection objective schematically shown in FIG. 1.

FIG. 2 shows the optical elements of the projection objective 10 in a true to scale meridional section. The design specification is given at the end of the description in tables 2 and 3. In table 2, the first column indicates the number of the refractive or reflective surface, the second column lists the radius R of that surface, the third column lists the distance between that surface and the next surface, the fourth column lists the material used for the fabrication of the optical element, the fifth column lists the optically utilizable clear semi-diameter of the optical element, and the sixths column indicates whether that surface is reflective or not.

Some of the surfaces of the optical elements have an aspherical shape. Table 3 lists the aspherical constants k, A, B, C, D, E, and F for those surfaces. The height z of a surface point parallel to the optical axis is given by $$z = \frac{ch^2}{1+\sqrt{1-(1+k)c^2h^2}} + Ah^4 + Bh^6 + Ch^8 + Dh^{10} + Eh^{12} + Fh^{14}$$

with h being the radial distance from the optical axis and c=1/R being the curvature of the surface.

Between an object plane 12 and an image plane 14, in which the mask M and the wafer W, respectively, are moved during the scanning process, the projection objective 10 has two intermediate image planes denoted by 16 and 18. The intermediate image planes 16, 18 divide the projection objective 10 into three lens groups each containing one pupil plane. In FIG. 2, the pupil planes are denoted by 20, 22 and 24, respectively.

The projection objective 10 comprises a total number of 20 lenses L1 to L20 and two concave mirrors 26, 28. The mirrors 26, 28 have spherical surfaces and are arranged between the first and second intermediate image plane 16, 18. Immediately in front of the mirrors 26, 28, negative meniscus lenses L10 and L11, respectively, are positioned. Each meniscus lens L10, L11 is designed as a truncated lens element arranged only at the side of the optical axis 0A where the adjacent mirror is positioned. Therefore the projection light passes each meniscus lens L10, L11 twice.

An aperture stop 30 is arranged between a region of largest beam diameter and the image plane 14. Between the second intermediate image plane 18 and the image plane 14 there is only one negative lens in the path of the projection light. This lens, which is denoted in FIG. 2 by L13, is a biconcave lens defining a shallow waist in the beam path. Avoiding negative lenses in the region of increasing and large beam diameters enables to keep the beam diameter small. This decreases the amount of optical material needed for the manufacture of the lenses in this part of the projection objective 10.

If D is the maximum lens element diameter in the part between the second intermediate image plane 18 and the image plane 14, and $c_1$ and $c_2$ are the curvatures of the concave mirrors 26, 28, then the following condition is fulfilled in the embodiment shown:

$$1 < D/(|c_1|+|c_2|) \cdot 10^{-4} < 6. \quad (1)$$

The curvatures $c_i$ are the reciprocals of the curvature radius at the vertex. If condition (1) is fulfilled, then a good balance between Petzval correction and positive power in the third objective part can be obtained. Apart from that, the projection objective 10 has a good correction of various aberrations, in particular of spherical aberration, coma, astigmatism and image curvature.

The projection objective 10 is designed as an immersion objective with a numerical aperture NA=1.2. This means that, during operation of the projection exposure apparatus PEA, the interspace between the last lens L20 and the wafer W is filled with an immersion liquid IL. In this exemplary embodiment, purified deionized water is used as immersion liquid IL.

Lens Material Selection Method

In the following a quantitative method will be explained for determining which lenses should be made of a fluoride crystal if the amount expensive fluoride crystals needed as lens material shall be kept low. This may also imply a suitable selection of crystal lattice orientations and the choice of different fluoride crystals.

In the following, the method is first described in general terms with reference to FIGS. 3 to 9. Further below the method will be applied to the projections objective 10 and to another alternative projection objective that is based on different design principles. It should be understood, however, that the method can be applied to any optical system of a projection exposure apparatus, i.e. also to illumination systems and to projection objectives that are not designed for immersion operation.

Figure 3:
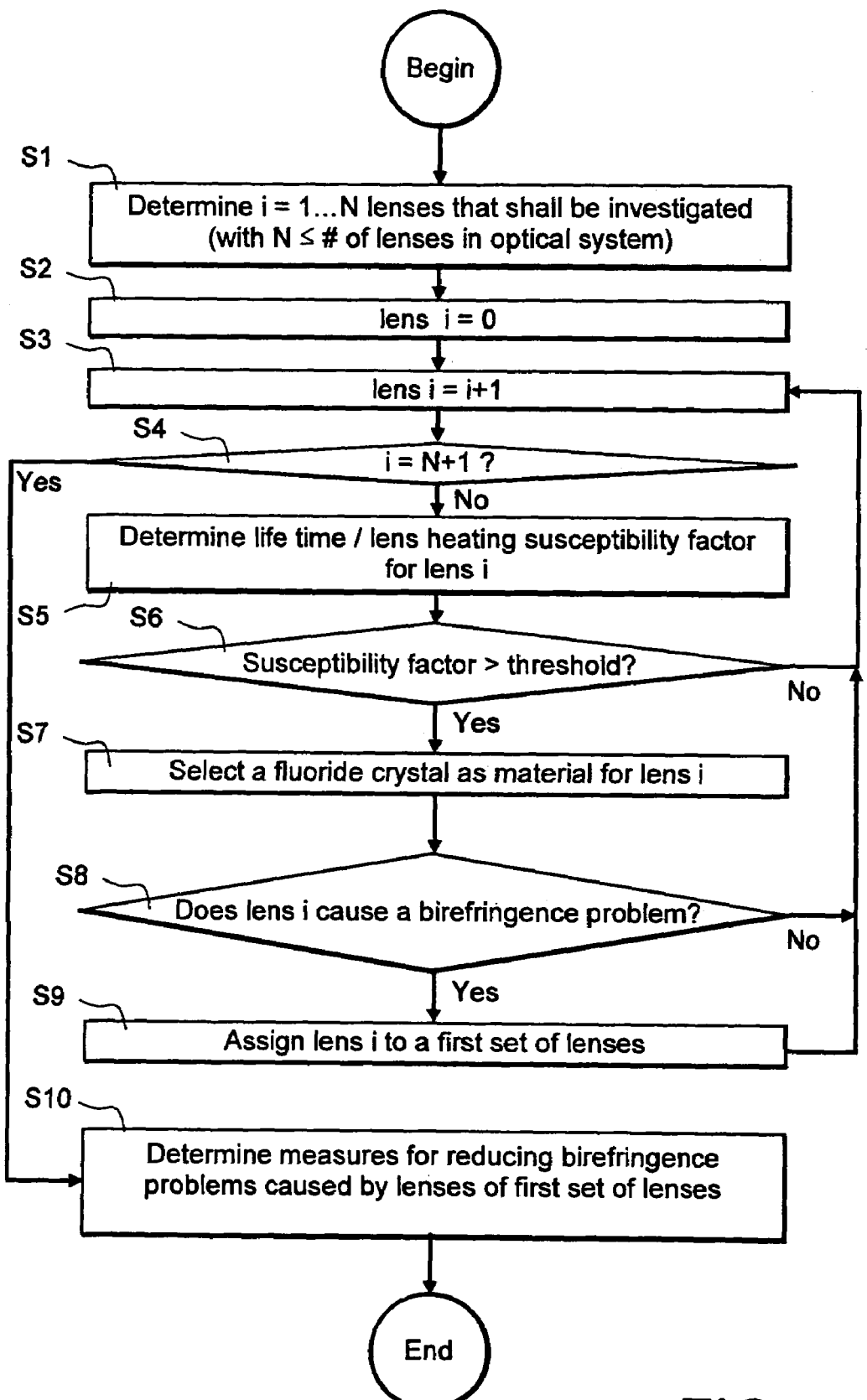
FIG. 3 is a flow diagram for a method according to the invention.

FIG. 3 shows a flow diagram illustrating steps S1 to S10. In a first step S1, a group of N lenses is determined that could, at least in principle, each be made of a fluoride crystal. Generally, all lenses of the optical system considered here could be made of a fluoride crystal. However, there may be reasons why certain lenses shall be excluded from the following considerations. For example, there may be plates with plane parallel surfaces made of a birefringent material for manipulating polarization properties of the projection light. In order to achieve the desired polarization property, it is usually not possible to deviate from the selected material and its orientation with respect to the polarization direction of the incoming projection light. Thus such elements can be set aside when carrying out the method.

All N lenses are assumed, in a first place, to be made of a conventional lens material such as synthetic quartz glass, but not from a fluoride crystal.

The following steps shall be carried out for all of the N lenses whose material shall be determined. If the method is performed on a computer system, a loop may be programmed starting with lens i=0 in a step S2 and then increasing the lens number i by 1 in a step S3. As soon as the number N is exceeded (step S4), the loop is finished.

Within the loop, a lifetime/lens heating susceptibility factor $K_{LT/LH}$ is determined for each lens i in a step S5. This susceptibility factor $K_{LT/LH}$ is defined such that it can serve as a quantitative measure of the susceptibility of the respective lens to deteriorations caused by lifetime effects and lens heating effects. Lifetime effects are irreversible changes of the material properties that are caused by the interaction of the material with intense projection light. For example, quartz glasses suffer from density variations that lead to irreversible changes of the index of refraction. Lens heating effects are reversible changes caused by the absorption of projection light and subsequent heating of the lens material. The heating often causes undesired variations of the shape of the lenses and also of their index of refraction. Both lifetime effects and lens heating effects usually result in imaging errors that may ultimately not be tolerable.

It has been found out that thick lenses with small diameters usually suffer more from lifetime and/or lens heating effects than thin lenses with large diameters. This dependency on the thickness D of the lenses and the diameter or clear aperture CA of the lenses may be expressed, for example, by the equation $$K_{LT/LH} = \frac{D}{\langle D \rangle} \left( \frac{\langle CA \rangle}{CA} \right)^2. \quad (2)$$

Here $\langle D \rangle$ denotes the mean centre thickness and $\langle CA \rangle$ the mean clear aperture of all N lenses.

It is to be understood that other and also more complicated functions may equally well or even better allow to determine which lenses within an optical system are susceptible for lifetime and lens heating effects. However, defining $K_{LT/LH}$ as a function of the centre thickness D and the clear aperture CA has been found to give good results, and this particularly holds true if equation (2) is used for defining $K_{LT/LH}$.

On the other hand, it is further to be understood that a determination of $K_{LT/LH}$ using equation (2) or a similar equation can only give a rough estimation of the susceptibility of particular lenses to lifetime and lens heating effects. If more accurate results are required, it is envisaged to determine those lenses, which are most susceptible for lifetime and lens heating effects, by numerical simulations. In such simulations, the shape of the projection light beam that passes through each individual lens under the actual operating conditions are taken into account. For example, it may be considered that the illuminated light field LF on the mask M may have different shapes that are adjusted to a particular mask to be projected onto the wafer W. Apart from that, the mask M itself influences the intensity distribution of the projection light within the projection objective 10.

If the optical system under consideration is not the projection objective but the illumination system, the illumination setting, which determines the angular distribution of the projection light, has a strong influence which lenses in the illumination system are subject to degradations due to lifetime and lens heating effects.

If a more rigorous computational method is used for determining the susceptibility of the lenses, such a method should nevertheless make it possible to determine a single quantity (or very few quantities at most) being a measure for the susceptibility to lens heating and lifetime effects. Only then it is possible to easily compare the susceptibility of the lenses to lifetime and lens heating effects.

In a step S6, the susceptibility factor $K_{LT/LH}$ determined in step S5 is compared to a predetermined threshold value. If the susceptibility factor exceeds the threshold value, a fluoride crystal such as calcium fluoride is selected as material for the respective lens in a step S7. By selecting a fluoride crystal as material for the lens i, material deteriorations due to lifetime and lens heating effects are considerably reduced. This is due to the significantly higher transmission of fluoride crystals compared to conventional quartz glass materials at small wavelengths. As a result of the low absorption, the projection light produces only a small amount of heat within the crystals. Further, degradations due to lifetime effects do not occur in fluoride crystals to a significant extent.

In a next step S8, it is determined whether the lens i may cause a birefringence problem. To this end, a geometrical birefringence factor $K^g_{IB}$ may be used as will be explained below. If the lens i made of a fluoride crystal does not cause a birefringence problem, there is no need for any measures directed to a compensation of birefringence. If, however, it is found in step S8 that the lens i may indeed cause a birefringence problem, it is assigned to a first set of lenses in a step S9. Thus the first set of lenses contains only lenses that should be made of a fluoride crystal and that require measures for birefringence compensation.

The steps S5 to S9 are then repeated for the next lens i+1.

If the quantity of available fluoride crystals is limited for cost or other reasons, the approach described above may be modified. In this case, the susceptibility factor $K_{LT/LH}$ of all lenses is determined. Then the lenses are sorted in the order of the susceptibility factor $K_{LT/LH}$. If the given quantity of fluoride crystals is sufficient to manufacture the lens with the highest susceptibility factor $K_{LT/LH}$ from a fluoride crystal, the required quantity is deducted from the original quantity. If the remaining quantity of fluoride crystals is sufficient to manufacture the lens with the second highest susceptibility factor $K_{LT/LH}$ from a fluoride crystal, the required quantity is deducted from the remaining quantity, and so on. In this way the k lenses having the highest susceptibility factor $K_{LT/LH}$ will be made of a fluoride crystal. The k lenses selected in this way are then subjected to the determination of step S8 and are assigned, depending on the result of this determination, to the first set of lenses according to step S9.

If all N lenses are investigated in this manner, measures for reducing birefringence problems caused by lenses of the first set of lenses are finally determined in a step S10.

These measures may be confined to the lenses of the first set of lenses, or it may be necessary to include additional lenses that do not belong to the first set of lenses. The latter implies that one or more lenses have to be made of a fluoride crystal only for the sake of reducing birefringence problems, i.e. although it would not be necessary to select a fluoride crystal as lens material for reducing adverse lifetime and lens heating effects.

Figure 4:
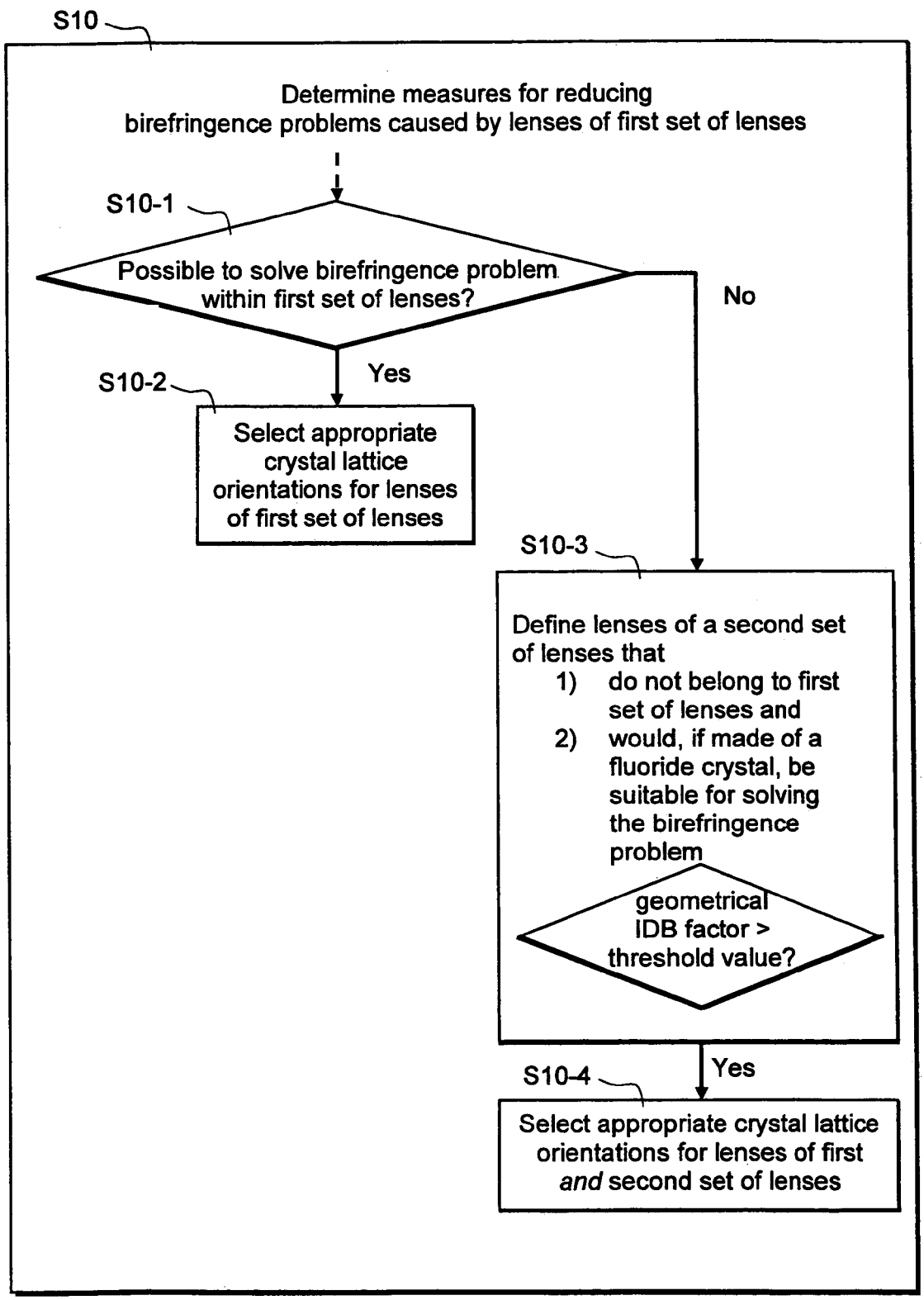
FIG. 4 is a flow diagram for an optional aspect of the method according to the invention.
Figure 5:
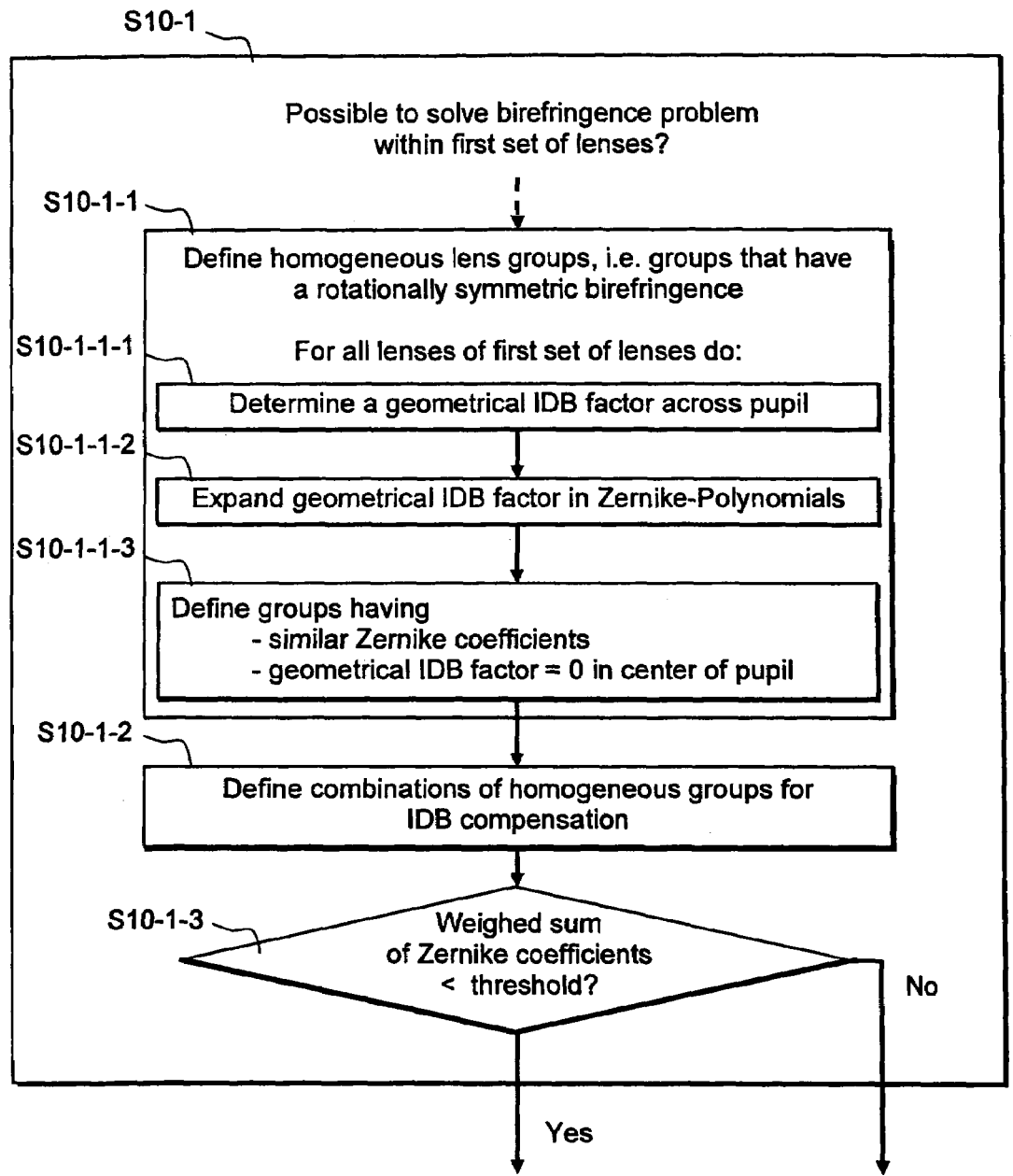
FIG. 5 is a flow diagram for a further optional aspect of the method according to the invention.

The aforementioned two alternatives are explained in more detail with reference to the flow diagram shown in FIG. 4.

In a step S10-1 it is determined whether it is possible to solve the birefringence problem within the first set of lenses. This means that the measures for compensating birefringence are confined to those lenses that have to be made of a fluoride crystal in order to avoid significant lifetime and/or lens heating problems. A possible method for making this decision is explained further below with reference to FIG. 5.

If it turns out in step S10-1 that it is indeed possible to confine the measures to the first set of lenses, appropriate crystal lattice orientations for lenses of the first set of lenses are selected in step S10-2. Examples for appropriate crystal lattice orientations are given further below. Alternatively or additionally, compensation of birefringence may be achieved by combining different crystals. For example, some lenses of the fist set of lenses could be made of $CaF_2$ crystals and some other lenses could be made of $BaF_2$. Birefringence can also be avoided by using isomorphous mixtures such as $Ca_{1-x}Ba_xF_2$. Further details relating to the use of such mixtures are described in the international application PCT/EP03/06402 whose full disclosure is incorporated herein by reference.

If it turns out in step S10-1 that it is not possible to solve the birefringence problem within the first set of lenses, a second set of lenses is defined in a step S10-3. Lenses of this second set of lenses do not belong to the first set of lenses, but nevertheless fluoride crystals are selected as materials. Even more, only those lenses can belong to the second set of lenses that display sufficiently strong birefringence effects. Otherwise these lenses could not be used for effectively compensating birefringence caused by lenses of the first set of lenses. The measures for reducing birefringence problems thus necessitate, in this case, the selection of fluoride crystals as materials not for avoiding degradations due to lifetime and/or lens heating effects, but solely for the sake of compensating undesired birefringence effects caused by lenses of the first set of lenses.

In a step S10-4 appropriate crystal lattice orientations for lenses of the first and of the second set of lenses are selected. Alternatively or additionally, compensation of birefringence may be achieved by a suitable selection of different crystals, as has been mentioned above.

In the following a method is explained that allows to determine whether it is possible to solve the birefringence problem within the fist set of lenses in a step S10-1. To this end reference is made to the flow diagram of FIG. 5.

Figure 6:
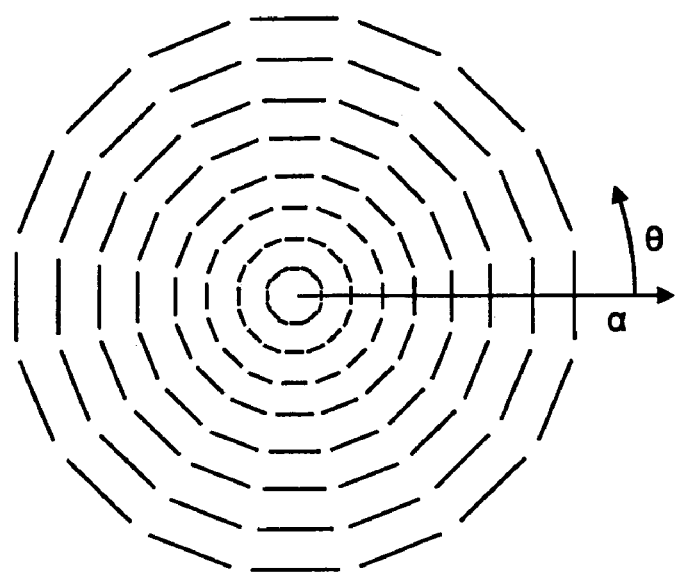
FIG. 6 shows a rotationally symmetric birefringence distribution achieved by a combination of two (100) $CaF_2$ crystals.
Figure 7:
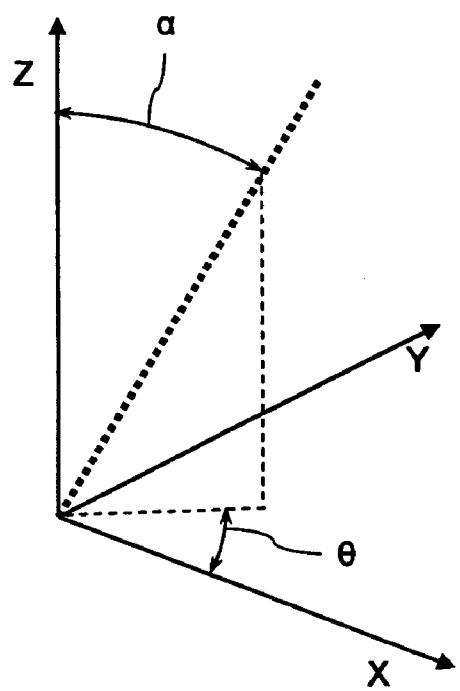
FIG. 7 is an illustration showing the angles that a light ray traversing a birefringent crystal forms with an optical axis.

In a first step S10-1-1, homogenous lens groups are defined. A lens group is referred to as homogenous if it has, as a whole, a rotationally symmetric birefringence distribution. An example for such a rotationally birefrince distribution is given in FIG. 6. Each line in FIG. 6 represents the amount and the direction of the birefringence $\Delta n$ ($\alpha$, $\theta$) for a ray direction defined by an aperture angle $\alpha$ and an azimuth angle $\theta$. As shown in FIG. 7, the aperture angle $\alpha$ denotes the angle between the optical axis (Z-axis) and the ray direction. The azimuth angle $\theta$ denotes the angle between a projection of the light ray on the XY-plane and the X-axis as reference direction.

Geometrically, the length of the lines shown in FIG. 6 is proportional to the length difference between the principal axes of an intersectional ellipse, while the direction of each line indicates the orientation of the longer principal axis of the intersectional ellipse. The intersectional ellipse is obtained as the intersection between the refractive index ellipsoid for a light ray in the direction ($\alpha$, $\theta$) and a plane that extends perpendicular to the direction of the light ray and cuts through the centre of the refractive index ellipsoid.

For defining homogenous lens groups in step S10-1-1, the following steps may be carried out for all lenses of the first set of lenses:

First, in a step S10-1-1-1, a geometrical birefringence factor $K^g_{IB}$ is determined, for each lens, across the pupil for one or more selected field points. The geometrical factor $K^g_{IB}$ is a measure of the susceptibility of a crystal to induce significant intrinsic birefringence for a light ray traversing the crystal irrespective of the selected crystal material and its crystal lattice orientation.

To his end, a birefringence factor $K_{IB}$ may first be defined according to the following equation (3):

$$K_{IB} = MqL \sin^2 \alpha (7 \cos^2 \alpha - 1). \tag{3}$$

L is the optical path length that the light ray passes within the lens. M denotes a material factor that is dependent on the selected fluoride crystal and the wavelength. Exemplary numerical values for the factor M for common fluoride crystals at wavelengths of 193 nm and 157 nm are given by $$M = \begin{cases} -3.4 \pm 0.2 \text{ nm/cm for } CaF_2 \text{ lenses at } \lambda = 193 \text{ nm} \\ -11.2 \pm 0.2 \text{ nm/cm for } CaF_2 \text{ lenses at } \lambda = 157 \text{ nm} \\ 33 \pm 3 \text{ nm/cm for } BaF_2 \text{ lenses at } \lambda = 157 \text{ nm} \end{cases} \tag{4}$$

The quantity q denotes an orientation factor given by $$q = \begin{cases} -1/2 & \text{for lenses in (100) material} \\ 1/3 & \text{for lenses in (111) material} \\ 1/8 & \text{for lenses in (110) material} \end{cases} \tag{5}$$

The different signs of the orientation factor q for (111) and (100) lenses reflect the orthogonal orientation of the crystal axes.

Thus the birefringence factor $K_{IB}$ is a measure for the resulting retardance (in nm) for a light ray passing a particular lens with an aperture angle $\alpha$. For details relating to the birefringence factor $K_{IB}$ reference is made to international patent application WO 04/23184 A1 whose full disclosure is incorporated herein by reference.

For the determination in step S10-1-1-1, not the birefringence factor $K_{IB}$ as such is used. Instead, the geometrical birefringence factor $K^g_{IB}$ is defined to be independent of the kind of fluoride crystal and its lattice orientation. This can be achieved, for example, by the following definition:

$$K^g_{IB} = K_{IB}/(Mq) \quad (6)$$

Within step S10-1-1-1, the geometrical birefringence factor $K^g_{IB}$ is determined across the pupil for each lens. If this distribution of the geometrical birefringence factor $K^g_{IB}$ across the pupil is similar for different lenses, these lenses can form a homogenous group.

In order to simplify the comparison of the $K^g_{IB}$ distributions across the pupil, it may be advantageous to expand the distributions in Zernike polynomials in a step S10-1-1-2. In a further step S10-1-1-3 groups are defined that have similar Zernike coefficients and whose geometrical birefringence factor $K^g_{IB}$ equals zero in or in close proximity of the centre of the pupil.

In a further step S10-1-2, combinations of homogenous groups are defined that allow to compensate the intrinsic birefringence. How such combinations can be formed is known in the art as such. In this context reference is made to U.S. Pat. No. 2004/0105170 A1 whose full disclosure is incorporated herein by reference.

In order to finally check whether the selected combination of homogenous groups indeed leads to the desired compensation of intrinsic birefringence, the possible combinations are investigated in a further step S10-1-3. In this step, the following weighed sum of Zernike coefficients may be computed as $$\sum_{\text{all lenses}} M^{(i)} q^{(i)} Z_n^{(i)} \leq Z_{th} \quad (7)$$

Here $M^{(i)}$ is the material factor of lens i, $q^{(i)}$ is the orientation factor of lens i, $Z_n^{(i)}$ is the n-th Zernike coefficient of the $K^g_{IB}$ expansion of lens i, and $Z_{th}$ is a predetermined threshold value. If this sum does not exceed the predetermined threshold $Z_{th}$, the respective combination of homogenous groups can be considered to sufficiently compensate birefringence within the first set of lenses. If, for a certain combination, the weight sum is above the threshold $Z_{th}$, another combination has to be considered. If none of the possible combinations fulfills equation (7), it is clear that the birefringence problem cannot be solved solely within the first set of lenses.

The threshold value $Z_{th}$ has to be determined in view of the specifications of the optical system. The tighter the specifications are in view of imaging quality, the smaller the threshold value $Z_{th}$ will usually be.

It is to be understood that the aforementioned method of defining homogenous groups achieves excellent results, but is nevertheless only exemplary. For example, instead of using equation (3) for the birefringence factor $K_{IB}$, the approximation $$K_{IB} = MqL \sin^2(2{,}17 \cdot \alpha_R) \quad (8)$$

can be used for aperture angles $\alpha$ of less than about 40°. Apart from that, it is possible to compare the distributions of the birefringence factor $K_{IB}$ in other ways than by expanding them in Zernike polynomials. Particularly, using another function system for the expansion or certain other numerical methods can be employed, as are known as such in the art.

If none of the possible combinations fulfills equation (7), the birefringence problem cannot be solved solely within the first set of lenses. Then, in the step S10-3, it has to be determined which one of the lenses that do not belong to the first set of lenses can make a contribution to solving the birefringence problem. In this context it has to be borne in mind that even if a lens is made of a fluoride crystal, it may nevertheless cause only very small retardances if the projection light passes the lens under aperture angles a for which the birefringence is neglectible. Since the geometrical birefringence factor $K^g_{IB}$ is a measure of the susceptibility to induce birefringence, it may be used for the determination in step S10-3. For example, only those lenses may be assigned to the second set of lenses (i.e. lenses that are used for birefringence compensation) that have a geometrical birefringence factor $K^g_{IB}$ satisfying $$K^g_{IB} > K_{th} \quad (9)$$

where $K_{th}$ is a threshold value suitably determined.

Similar considerations also apply to step S8 in which it is determined whether a lens that shall be made of a fluoride crystal may cause a birefringence problem. For example, only those lenses may be assigned to the first set of lenses (i.e. lenses that require birefringence compensation) that have a geometrical birefringence factor $K^g_{IB}$ satisfying equation (9) with the same threshold value or a different one.

The geometrical birefringence factor $K^g_{IB}$ varies over the pupil of the lens. Since it is inconvenient to handle and compare a function to a threshold function, a single value may be determined that shall characterize the amount of birefringence induced by the lens. For example, it is possible to use a mean value over the pupil to this end. In the following not a mean value, but a maximum value of the geometrical birefringence factor is used. Therefore the geometrical birefringence factor $K^g_{IB}$ is to be understood as $K^g_{IB} = \max(K^g_{IB}$ over pupil).

For finding appropriate crystal lattice orientations for lenses of the first and the second set of lenses in step S10-4, a similar method can be employed as has been described above with reference to FIG. 5. The only difference is that the steps S10-1-1 to S10-1-3 relate not only to lenses of the first set of lenses, but also to lenses of the second set of lenses. This means, for example, that lenses of different sets of lenses may together form a homogenous lens group, or that homogenous lens groups of different sets of lenses are combined such that a significant compensation of birefringence is achieved.

When the steps S10-3 and S10-4 are carried out, the lifetime/lens heating susceptibility factor $K_{LT/LH}$ may also be taken into account. This is because it is often preferred if the lenses of the second set of lenses do not only have a birefringence compensating effect, but these lenses should also have a large lifetime/lens heating susceptibility factor $K_{LT/LH}$ in order to avoid degradations due to lifetime and/or lens heating effect. This is a complex task that can, in the general case, be solved using known optimization computer programs.

Birefringence Compensation

In the following various approaches are described how adverse effects caused by birefringence of the first set of lenses can be reduced in step S10. The approaches differ depending on the number of lenses contained in the first set of lenses. In order to make the following description less abstract, it is assumed that $CaF_2$ is used as a fluoride crystal material. However, similar considerations apply to other fluoride crystals as well, for example $BaF_2$, $SrF_2$ or mixed crystals such as $Ca_{1-x}Ba_xF_2$.

One Lens made of $CaF_2$

If a (100) $CaF_2$ crystal is used, i.e. a crystal having its [100] crystal axis (or an equivalent axis) aligned along the optical axis, the birefringence distribution has a fourfold symmetry. This symmetry is shown in FIG. 4C of U.S. Pat. No. 2004/0105170 A1 that has been mentioned before and is incorporated herein by reference. A fourfold symmetry of the birefringence distribution does not cause serious problems as long as the lens is exposed to projection light that has itself an angular distribution with a fourfold symmetry. Such a case may occur in illumination systems operated with certain illumination settings. For example, in a dipole or a quadrupole illumination setting a pupil plane is illuminated at two or four areas having equal distances from the optical axis. If the projection light is tangentially polarized and the crystal lattice is appropriately rotated around the optical axis, the asymmetry of the birefringence distribution will not have any adverse effects.

In projection objectives, however, such conditions rarely prevail. Thus, in order to achieve at least a symmetrical birefringence distribution, a single $CaF_2$ lens has to be split into two lens parts. Then the relative angular position of the lens parts is changed by rotating one or both lens parts around the optical axis. Then the rotated or "clocked" lens parts are combined again, for example by optically contacting them. Instead of splitting a single lens, it is of course also possible to fabricate the lens parts independently from different crystal blanks.

Similar considerations also apply to (111) $CaF_2$ lenses because the birefringence distribution has a threefold symmetry, as is shown in FIG. 5C of U.S. Pat. No. 2004/0105170 A1. Since there are usually no illumination settings having a threefold symmetry in their angular distribution, significant birefringence cannot be avoided without splitting up the lens.

When determining where the lens has to be split up, it may be taken into account that the geometric path length of a ray suffering most from intrinsic birefringence should be the same in both lens parts. This ray impinges on the lens with an aperture angle $\alpha_m$ that depends on the crystal lattice orientation.

For example, $\alpha_m = 0$ if the lens is made of a (110) material. If the lens is made of (111) material, $\alpha_m$ is 35,26° or the maximum occurring aperture angle, whatever is smaller. Here 35,26° is the angle between the (111) crystal axis and the (110) crystal axis.

In the case of a (100) material, $\alpha_m$ is either 45° or the maximum occurring aperture angle, whatever is smaller. 45° is the angle between the (100) crystal axis and the (110) crystal axis.

Figure 8:
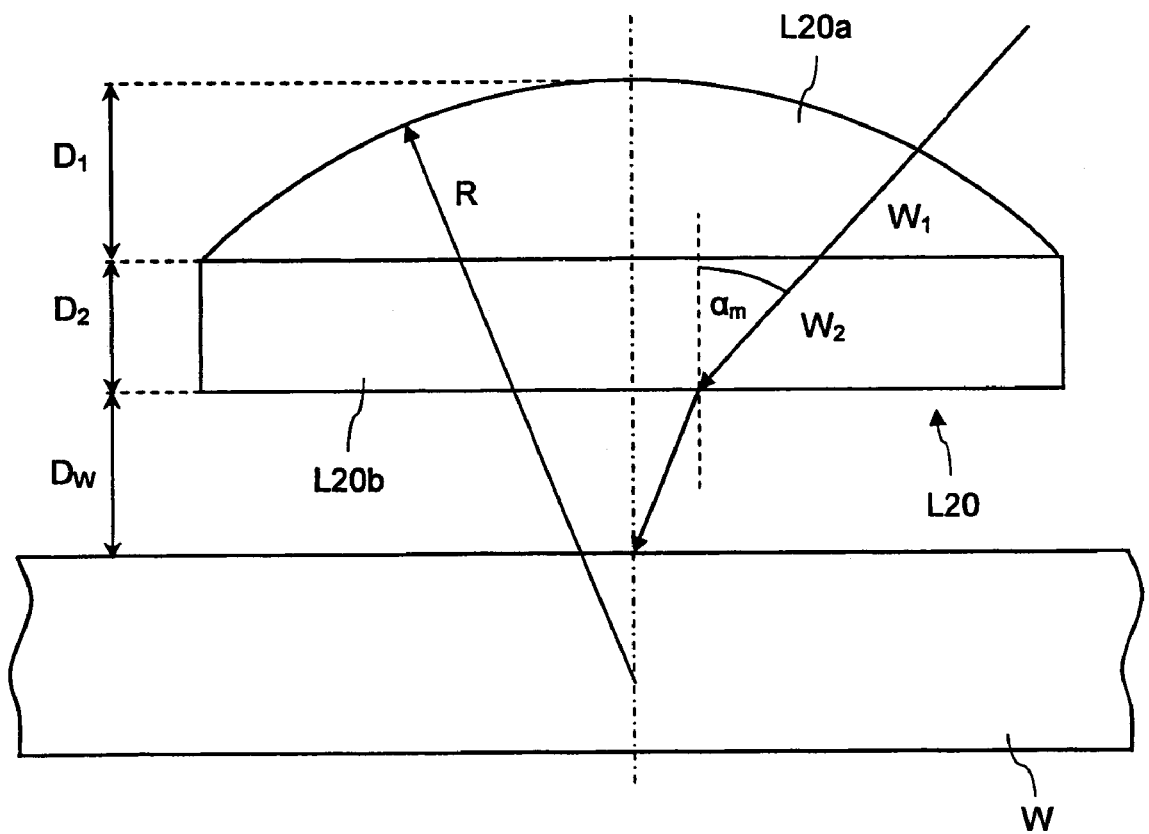
FIG. 8 is a sectional view showing the last lens of the projection objective of FIG. 2, this last lens being split up into two lens parts.

For example, if only the lens L20 shall be made of $CaF_2$ in order to avoid lifetime and/or lens heating problems, the lens L20 could be split up in two lens parts L20a, L20b in the way shown in FIG. 8. If only rays are considered that meet the optical axis when they impinge on the wafer W, the geometrical path lengths $W_1$ and $W_2$ are equal if the following condition holds:

$$\frac{D_1}{D_2} = \frac{2D}{L\cos\alpha_m} - 1 \quad (10)$$

wherein $$D = D_1 + D_2 \quad (11)$$

$$L = -(R-D)\cos\alpha_m - 1\sin\alpha_m + \sqrt{[(R-D)\cos\alpha_m + 1\sin\alpha_m]^2 + R^2 - (R-D)^2 - 1^2}$$

$$1 = D_W \frac{n_m \sin\alpha_m}{\sqrt{n_a^2 - n_m^2 \sin^2\alpha_m}}$$

Here $D_1$ and $D_2$ are the centre thicknesses of the lens parts L20a, L20b, $n_m$ is the refractive index of the lens material, $n_a$ is the refractive index of the immersion liquid introduced between the lens L20 and the wafer W, R is the radius of the convex surface of the upper lens part, and $D_W$ is the distance between the lens L20 and the wafer W. If the distance $D_W$ can be neglected, the following equation may be used instead of equation (10):

$$\frac{D_1}{D_2} = \frac{2D}{\cos\alpha_m\left[-(R-D)\cos\alpha_m + \sqrt{(R-D)^2\cos^2\alpha_m + D(2R-D)}\right]} - 1 \quad (12)$$

For rays that do not meet the optical axis when they impinge on the wafer W, the correct value for the ratio $D_1/D_2$ may differ from those determined with equations (10) or (12) by up to 50%.

Two Lenses made of $CaF_2$

With only two lenses that shall be made of $CaF_2$, a complete compensation of intrinsic birefringence cannot be achieved without splitting up both lenses. If only small aperture angles occur, both lenses may be made of (110) material. If the crystal lattices are rotated ("clocked") by 90° around the optical axis, the intrinsic birefringence is small for small aperture angles. This can be seen from FIG. 6D of the aforementioned U.S. Pat. No. 2004/0105170 A1.

In a general case, however, it is preferred to select crystal lattice orientations such that both lenses form a homogenous (100) or (111) group. These groups will then have a rotationally symmetric birefringence distribution that does not deteriorate the imaging quality in the case of various illumination settings, for example a dipole illumination setting with tangentially polarized light. The rotationally symmetric birefringence distribution is shown in FIGS. 4D and 6D of U.S. Pat. No. 2004/0105170 A1 for the (100) and (111) groups, respectively.

In order to form a homogenous group, both lenses should have similar centre thicknesses and be traversed by the projection light with similar aperture angles. This requirement can be taken into account during the design of the optical system by appropriately adjusting the lens thicknesses. During the design process, the geometrical birefringence factor $K^g_{IB}$ can be used as a criterion, as is disclosed in WO 04/230184 A whose full disclosure is incorporated herein by reference.

When a decision has to be made whether (100) or (111) material should be used, the following points may be considered:

An advantage of a (100) homogenous group may be that the resulting rotationally symmetric birefringence distribution can be compensated with stress induced birefringence in the same or in other lenses that do not necessarily have to be made of a fluoride crystal. This is due to the fact that often stress induced birefringence has a rotationally symmetric distribution with a slow birefringence axis being oriented radially. This is described in more detail in U.S. patent application Ser. No. 10/997,455 whose full disclosure is incorporated herein by reference.

An advantage of a (111) homogenous group may be that this material is more readily available, cheaper and has often a better quality. Another advantage is that a homogenous group made of (111) material has a birefringence that is about 1.5 times smaller than the birefringence caused by a (100) homogenous group.

Instead of forming homogenous groups made of the two lenses, it is also possible to split up one or both lenses into two lens parts so that the options are open that are described below for the cases with three and with at least four lenses.

Three Lenses made of $CaF_2$

It is not possible to achieve a complete compensation of birefringence with only three lenses made of $CaF_2$. However, it is possible to have two lenses made of (110) crystals with a clocking angle of 90°. The result is a birefringence distribution having a fourfold symmetry, as is shown in FIG. 6D of U.S. Pat. No. 2004/0105170 A1. The resulting birefringence can, at least to a large extend, compensated if the remaining third lens is made of a (100) crystal. A single (100) crystal has also a birefringence distribution with a fourfold symmetry. However, a (100) crystal on the one hand and a combination of two clocked (110) crystals on the other hand have orthogonal slow birefringence axes. This results in a substantial compensation of birefringence.

If one or more lenses are split into two or more lens parts, the considerations apply that are discussed below for the case of four or more lenses.

Four or More Lenses made of $CaF_2$

Having four or more lenses made of $CaF_2$ allows to almost completely compensate the birefringence by forming two homogenous groups in which one group compensates the birefringence induced by the other groups. The various possibilities to achieve this compensation are described in the aforementioned U.S. Pat. No. 2004/0105170 A1.

Crystal Lattice Tilt

A further measure for reducing birefringence problems caused by lenses of the first set of lenses can be to tilt the crystal axis, which is usually aligned with the optical axis, by a certain tilting angle. This is an appropriate measure in those cases in which the projection light beam as a whole obliquely passes through the lens.

This situation occurs, for example, in projection objectives having an off-axis light field LF. In such instances a principal ray emanating from the geometrical centre of the light field LF on the mask M can be taken as a measure for the obliqueness of the projection light beam in the lens. If this aperture angle exceeds a certain value or—what is equivalent—the geometrical birefringence factor $K^g_{IB}$ of such a principal ray exceeds a certain value, it may be considered to tilt the crystal lattice in such a way that the crystal axis, which is usually oriented along the optical axis, is aligned parallel or almost parallel to the direction of the principal ray considered here. Tilting the crystal lattice in this manner results in a more symmetrical birefringence distribution. This distribution can be more easily compensated for by other lenses made of fluoride crystals.

Figure 9:
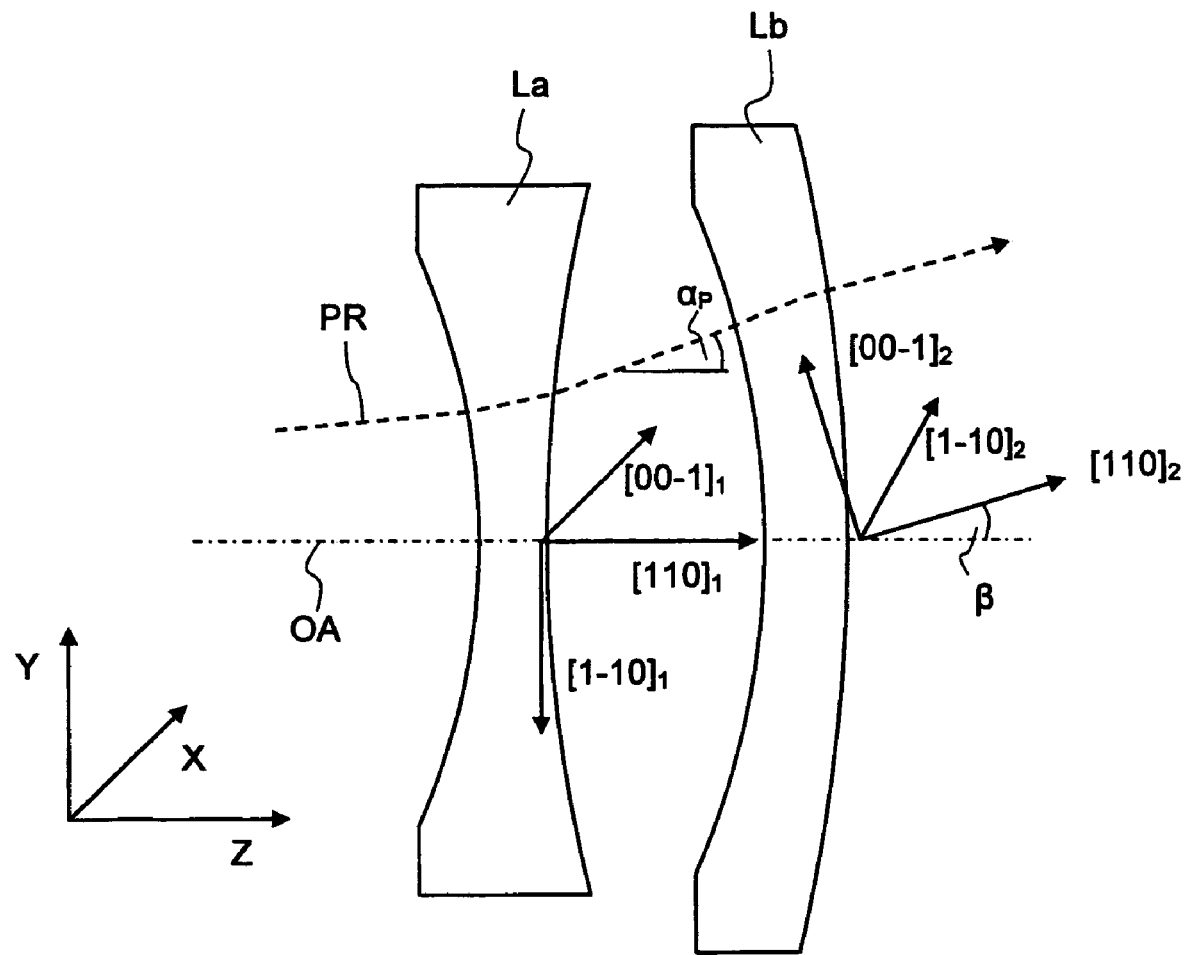
FIG. 9 is a sectional view showing two lenses made of $CaF_2$, one of which having a crystal lattice that is tilt with respect to an optical axis.

This is shown in the exemplary illustration of FIG. 9. Two arbitrary lenses La and Lb are traversed by a projection light beam that is represented by a single principle ray PR that has emerged from the centre of the light field LF. In the example shown, both lenses La and Lb are made of (110) crystals, i.e. $CaF_2$ material in which the (110) crystal axis is at least approximately aligned along the optical axis OA.

The principal ray PR enters the second lens Lb with an aperture angle $\alpha_P$ of approximately 22°. This means that the projection light beam as a whole passes the second lens Lb obliquely. Since the second lens Lb is made of a fluoride crystal, intrinsic birefringence occurs that is difficult to compensate for by using other lenses made of fluoride crystals.

In order to simplify the compensation, the crystal lattice of the second lens Lb is tilted such that the crystal axis (110) forms an angle $\beta$ with the optical axis OA. This angle $\beta$ is at least approximately equal to the aperture angle $\alpha_P$ of the principal ray PR. This ensures a more rotationally symmetric birefringence distribution that can be better compensated for by other lenses made of a fluoride crystal.

Application of Lens Material Selection Method to the Projection Objective 10

In the following the application of the lens material selection method described above to the projection objective 10 shown in FIG. 2 is described.

Table 1 lists, for all lenses L1 to L20, the aperture angle $\alpha$ of a principle ray emanating from the centre of the light field LF, the geometrical birefringence factor $K^g_{IB}$ of this principal ray, the maximum birefringence factor from all rays emanating from the centre of the light field LF, and the lifetime/lens heating susceptibility factor $K_{LT/LH}$. Since the lenses L10 and L11 are traversed by the projection light twice, the respective angles and factors are indicated for each propagation direction.

TABLE 1

| Lens | α [deg] | $K^g_{IB}$ [mm] for principle ray | Maximum $K^g_{IB}$ [mm] | $K_{LT/LH}$ |
| --- | --- | --- | --- | --- |
| L1 | 3.9 | 0.5 | 6.2 | 0.9 |
| L2 | 4.7 | 0.6 | 4.9 | 0.6 |
| L3 | 0.1 | 0.0 | 7.0 | 1.0 |
| L4 | 2.2 | 0.2 | 6.7 | 1.1 |
| L5 | 10.4 | 10.5 | 19.3 | 3.6 |
| L6 | 9.1 | 2.6 | 2.6 | 1.7 |
| L7 | 14.1 | 5.5 | 13.8 | 1.4 |
| L8 | 9.9 | 7.3 | 7.4 | 1.5 |
| L9 | 7.8 | 3.4 | 4.5 | 0.9 |
| L10 (1) | 9.1 | 2.5 | 6.5 | 0.2 |
| L10 (2) | 21.4 | 11.1 | 11.9 | 0.3 |
| L11 (1) | 21.6 | 11.1 | 11.2 | 0.3 |
| L11 (2) | 9.4 | 2.5 | 7.0 | 0.3 |
| L12 | 5.7 | 2.2 | 5.3 | 1.3 |
| L13 | 4.0 | 0.6 | 9.8 | 0.9 |
| L14 | 2.2 | 0.3 | 23.3 | 1.3 |
| L15 | 2.2 | 0.2 | 14.1 | 0.8 |
| L16 | 3.2 | 0.9 | 5.7 | 0.8 |
| L17 | 3.6 | 1.1 | 3.0 | 0.7 |
| L18 | 3.5 | 1.5 | 22.0 | 1.4 |
| L19 | 1.8 | 0.2 | 32.9 | 2.1 |
| L20 | 0.1 | 0.0 | 58.3 | 10.7 |

The threshold value for the lifetime/lens heating susceptibility factor $K_{LT/LH}$ has been determined to be 1.2. This means that all lenses with $$K_{LT/LH} > 1.2 \qquad (13)$$

are significantly susceptible to deterioration due to lifetime and/or lens heating effects and consequently should be made of a fluoride crystal such as $CaF_2$. Thus, according to step S7, a fluoride crystal, here $CaF_2$, is selected as material for lenses L5, L6, L7, L8, L12, L14, L18, L19 and L20.

Next, a threshold value $K_{th}$ for the maximum geometrical birefringence factor $K^g_{IB}$ is determined for the evaluation in step S8. In the present case, this value is determined to be $K_{th} = 3$ mm.

From the lenses for which equation (13) applies, only the lens L6 has a geometrical birefringence factor $K^g_{IB}$ below that threshold $K_{th}$. Consequently, the lens L6 causes a birefringence, but this is so small that it does not have to be compensated for. In turn, the lens L6 cannot be used for an effective birefringence compensation for other lenses made of $CaF_2$. Consequently, only lenses L5, L6, L7, L8, L12, L14, L18, L19 and L20 form the first set of lenses.

Next, it is determined which lens of the first set of lenses is exposed to an oblique projection light beam to such an extent that the crystal lattice should be tilted in the direction of the principal ray. To this end, a threshold value for the geometrical birefringence factor $K^g{}_{IB}$ of the principal ray is determined to be 0.3 mm. As a result, all lenses of the first set of lenses except the last lens L20 should be made of a material with a crystal lattice tilted in the direction of the principal ray.

In the following various approaches to achieve a birefringence compensation in the last section of the projection objective 10 are described. This last section comprises all lenses between the stop 30 and the immersion liquid IL, i.e. the lenses L18, L19 and L20. Since these lenses belong to the first set of lenses, $CaF_2$ is selected as material for all three lenses of this section of the projection objective 10.

First a case is considered in which the last lens L20 is made of (100) crystal material. If the lens L20 is split up into two lens parts rotated around the optical axis by 45°, a more rotationally symmetrical birefringence distribution may be achieve. The maximum aperture angle occuring at this last lens L20 is about 54°. The angle $\alpha_m$ is then given by $$\alpha_m = \min(45°, \alpha_{max}) = 45° \quad (14)$$

Using equations (10) and (11) gives an optimum thickness ratio $D_1/D_2 = 1,51$. This configuration results in a birefringence distribution which is, at least approximately, rotationally symmetric. The orientation of the fast birefringence axis is radial.

If (111) crystal material is used for the last lens L20 instead, the optimum thickness ratio $D_1/D_2$ of the two lens parts rotated by 60° around the optical axis is 1,27. This configuration results in a birefringence distribution that is significantly less rotationally symmetric as in the case of (100) crystals discussed above.

As a further alternative, the case is considered in which the last lens L20 is made of (110) crystal material. The last lens L20 is split into two lens parts having a thickness ratio of $D_1/D_2=1$ and rotated relative to each other by a clocking angle of 90°. This results in a birefringence distribution having a fourfold symmetry. For compensating the birefringence, an additional lens, namely lens L15, may be made of $CaF_2$. The lens L15 has a lifetime/lens heating susceptibility factor $K_{LT/LH}$ that is less than the threshold value of 1,2 and thus does not belong to the first group. However, the lens L15 has a maximum geometrical birefringence factor $K^g{}_{IB}$ significantly exceeding $K_{th}=3$ mm so that it may be assigned to the second set of lenses and is therefore principally suitable to compensate the intrinsic birefringence caused by the split up lens L20.

For example, if the lens L15 is made of a (100) crystal material and the azimuthal orientation of the (100) material is selected such that the fast birefringence axis is approximately perpendicular to the fast axis of the birefringence distribution produced by the last lens L20, a good birefringence compensation is possible.

Additional lenses made of (100) materials with the same crystal lattice orientation as the lens L15 may enhance the compensation.

Application of Lens Material Selection Method to Another Projection Objective

Figure 10:
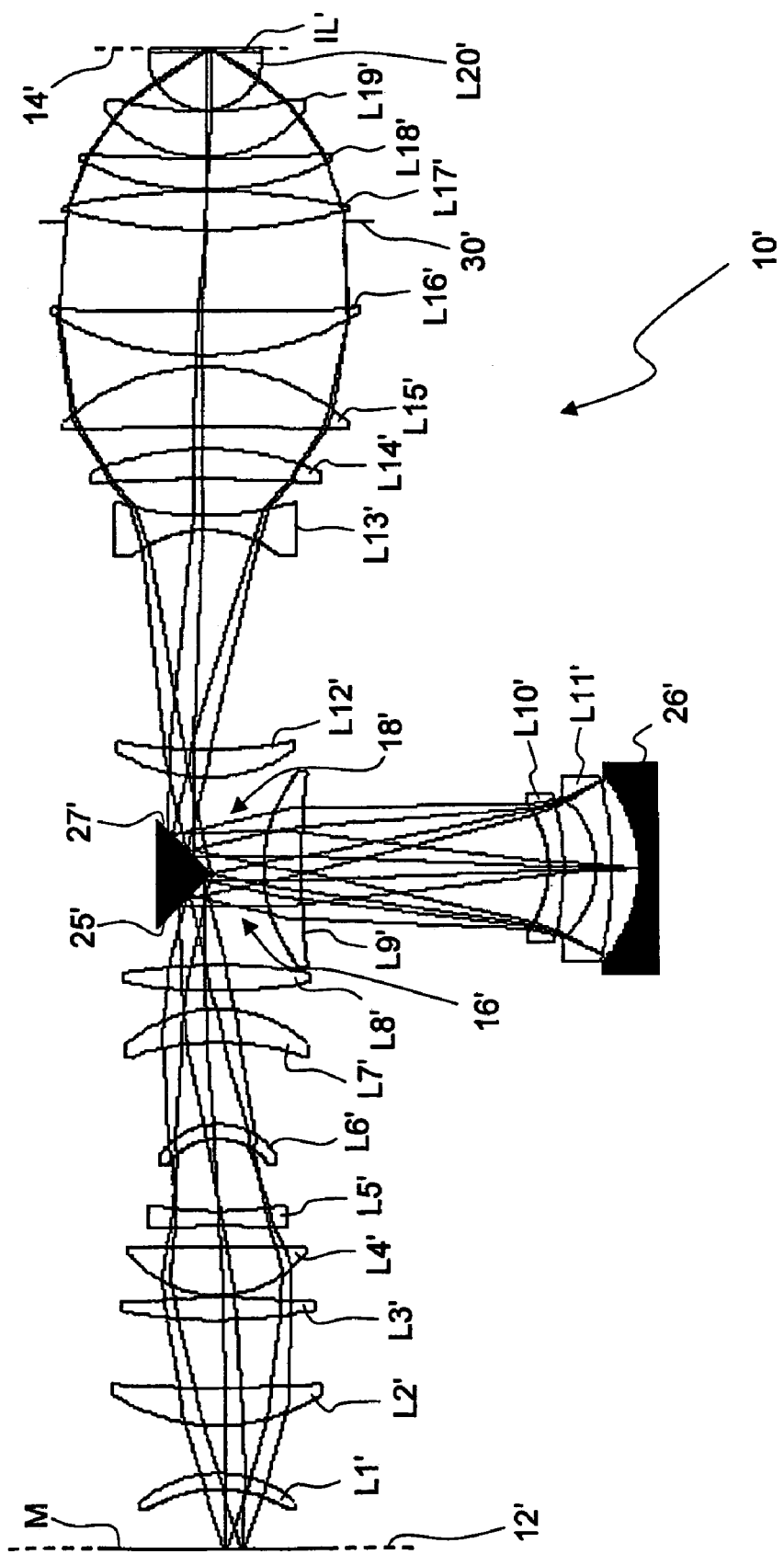
FIG. 10 is a sectional view showing optical elements of a projection objective.

In the following the application of the new lens material selection method to another projection objective 10' shown in FIG. 10 is described.

FIG. 10 shows the optical elements of the projection objective 10' in a true to scale meridional section. The design specification is given at the end of the description in tables 4 and 5. In table 4, the first column indicates the number of the refractive or reflective surface, the second column lists the radius R of that surface, the third column lists the distance between that surface and the next surface, the fourth column lists the material used for the fabrication of the optical element, and the sixths column indicates whether the surface is reflective.

Table 5 lists the aspherical constants k, A, B, C, D, E, and F for aspherical surfaces contained in the projection objective 10'.

Between an object plane 12' and an image plane 14', in which the mask M and the wafer W, respectively, are moved during the scanning process, the projection objective 10' has two real intermediate image planes denoted by 16' and 18'. The intermediate image planes 16', 18' divide the projection objective 10' into three lens groups each containing a pupil plane and having a positive refractive power.

The projection objective 10' comprises a total number of 20 lenses L1' to L20', two plane folding mirrors 25', 27' arranged perpendicular to each other, and one concave mirror 26'. The concave mirror 26' has a spherical surface and is arranged between the first and second intermediate image plane 16', 18'. The projection light passes the lenses L9', L10' and L11' positioned between the folding mirrors 25', 27' and the concave mirror 26' twice.

An aperture stop 30' is arranged in the last lens group between the second intermediate image plane 18' and the image plane 14'.

The projection objective 10' is designed as an immersion objective. This means that, during operation of the projection exposure apparatus PEA, the interspace between the last lens L20' and the image plane 14' is filled with an immersion liquid IL'. In this exemplary embodiment, purified deionized water is used as immersion liquid IL'.

The projection objective 10' is similar to a projection objective shown in FIG. 3 of U.S. patent application Ser. No. 60/571,533 filed May 17, 2004. For further details, reference is made to this earlier application assigned to the applicant.

TABLE 6

| Lens | $K^g{}_{IB}$ [mm] for marginal ray | $K_{LT/LH}$ |
|---|---|---|
| L1' | 5.3 | 0.6 |
| L2' | 1.8 | 0.8 |
| L3' | 0.4 | 0.6 |
| L4' | 5.2 | 1.7 |
| L5' | 2.1 | 1.0 |
| L6' | 2.0 | 1.4 |
| L7' | 0.2 | 0.9 |
| L8' | 2.3 | 0.5 |
| L9' | 4.3 | 1.6 |
| L10' | 20.8 | 1.9 |
| L11' | 74.5 | 1.6 |
| L12' | 1.8 | 0.6 |
| L13' | 17.6 | 0.7 |
| L14' | 17.0 | 0.8 |
| L15' | 12.3 | 1.1 |
| L16' | 0.7 | 0.8 |
| L17' | 1.3 | 1.0 |
| L18' | 8.3 | 0.9 |
| L19' | 30.9 | 1.8 |
| L20' | 52.4 | 5.5 |

Table 6 lists, for all lenses L1' to L20', the geometrical birefringence factor $K^g{}_{IB}$ for a marginal ray emanating from an axial object point in the object plane 12' (second column) and the lifetime/lens heating susceptibility factor $K_{LT/LH}$ (third column) for the lenses L1' to L20'. The respective values for an field point in the center of the light field LF differ only to a small extent from these values so that a computation for an axial object point gives a good approximation. Since the lenses L9', L10' and L11' are traversed by the projection light twice, the respective quantities for these lenses are the sum of the quantities obtained at each traversal.

In a first embodiment of the projection objective 10', the threshold value for the lifetime/lens heating susceptibility factor $K_{LT/LH}$ has been determined to be 5. This means that all lenses with $$K_{LT/LH} > 5 \quad (13)$$

are significantly susceptible to deteriorations due to lifetime and/or lens heating effects and consequently should be made of a fluoride crystal such as $CaF_2$. With this determination of the threshold value for the lifetime/lens heating susceptibility factor $K_{LT/LH}$, a fluoride crystal, here $CaF_2$, should be selected according to step S7 only for the last lens L20'.

The lens L20' has a very large geometrical birefringence factor $K^g_{IB}$ of more than 52.4 and thus causes significant birefringence. Therefore it is necessary to compensate for the birefringence caused by the lens L20'.

The most promising approach to compensate this birefringence is to split up the lens L20' into two lens parts rotated around the optical axis. If a (100) crystal material is selected, a relative rotation by 45° results in a more rotationally symmetrical birefringence distribution.

Using equations (10) and (11) gives an optimum thickness ratio $D_1/D_2 = 2 \pm 20\%$. This configuration results in a birefringence distribution which is, at least approximately, rotationally symmetric. The orientation of the fast birefringence axis is radial.

If (111) crystal material is used for the last lens L20' instead, the optimum thickness ratio $D_1/D_2$ of the two lens parts rotated by 60° around the optical axis is $1.5 \pm 20\%$. This configuration results in a birefringence distribution that is significantly less rotationally symmetric as in the case of (100) crystals discussed above.

In a second embodiment of the projection objective 10', the threshold value for the lifetime/lens heating susceptibility factor $K_{LT/LH}$ has been determined to be 1.8. This means that all lenses with $$K_{LT/LH} > 1.8 \quad (13)$$

are significantly susceptible to deterioration due to lifetime and/or lens heating effects and consequently should be made of a fluoride crystal such as $CaF_2$. With this determination of the threshold value for the lifetime/lens heating susceptibility factor $K_{LT/LH}$, a fluoride crystal, here $CaF_2$, should be selected according to step S7 not only for the last lens L20', but also for the lenses L10' and L19'.

Since these lenses L10' and L19' are now, compared with the first embodiment shown in FIG. 10, made of a material having a different index of refraction, the design of the projection objective 10' has to be slightly adjusted. Tables 7 and 8 contain the adjusted design specification of the projection objective 10'.

The most promising approach to compensate this birefringence is to split up the lens L20' into two lens parts rotated around the optical axis. If (111) crystal material is used for the last lens L20', the optimum thickness ratio $D_1/D_2$ of the two lens parts rotated by 60° around the optical axis is $1.5 \pm 30\%$.

The lenses L10' and L19' may be made, for example, of a (100) crystal material, with their crystal lattices rotated around the optical axis by 45° or an uneven multiple thereof. This ensures a good mutual compensation of the retardances caused by the birefringent lenses L10' and L19'.

In a third embodiment of the projection objective 10', the threshold value for the lifetime/lens heating susceptibility factor $K_{LT/LH}$ is still 1.8 so that the last lens L20' and the lenses L10' and L19' are made of a fluoride crystal material.

However, if the compensation achieved with three lenses L10', L19' and L20' is considered to be insufficient (step S10-1), it may be envisioned to improve the compensation by selecting a fluoride crystal for an additional lens. L14' is a good candidate for this selection because according to table 6, the lens L14' has, in spite of its small lifetime/lens heating susceptibility factor $K_{LT/LH}$ of 0.8, a large geometrical birefringence factor $K^g_{IB} = 17.0$ (see step S10-3).

A fourth lens made of a fluoride crystal material makes it possible to choose different compensation approaches. For example, the last two lenses L19' and L20' may be made of (111) crystals with their crystal lattices rotated around the optical axis by an angle of 60° or an uneven multiple thereof. These two lenses L19' and L20' then form a first homogeneous lens group (step S10-1-1) having an overall symmetrical birefringence distribution in which the slow birefringence axis is radially arranged, as is shown in FIG. 5D of U.S. Pat. No. 2004/0105170 A.

The other two crystal lenses L10' and L14' may then be made of (100) material with their crystal lattices rotated around the optical axis by an angle of 45° or an uneven multiple thereof. These two lenses L10' and L14' then form a second homogeneous lens group having an overall symmetrical birefringence distribution in which the slow birefringence axis is tangentially arranged, as is shown in FIG. 4D of U.S. Pat. No. 2004/0105170 A.

The combination of the two homogeneous lens groups with orthogonal birefringence distributions according to step S10-1-2 results in a very good compensation of retardances caused by the four intrinsically birefringent lenses L10', L14', L19' and L20'.

Since the lens L14' is made of a fluoride crystal instead of glass, the design of the projection objective 10' has to be slightly adjusted again. Tables 9 and 10 contain the adjusted design specification of the projection objective 10'.

TABLE 2

| | | NA = 1.2, β = 0.25 | | | | |
|---|---|---|---|---|---|---|
| Field | a | b | c | Wavelength | | 193.3 nm |
| | 26 | 4.5 | 4.75 | $n_{SiO2}$ | | 1.56049116 |
| | | | | $n_{CAF2}$ | | 1.50110592 |
| | | | | $n_{H2O}$ | | 1.4368 |
| Surface | Radius [mm] | | Thickness [mm] | Material | ½Diam. [mm] | Type |
| 0 | ∞ | | 31.999392757 | AIR | 64.675 | |
| 1 | 149.202932404 | | 20.120662646 | SIO2 | 82.837 | |

TABLE 2-continued

| | | | | | |
|---|---|---|---|---|---|
| 2 | 233.357095260 | 1.010428853 | AIR | 82.195 | |
| 3 | 172.529012606 | 14.999455624 | SIO2 | 83.021 | |
| 4 | 153.116811658 | 37.462782355 | AIR | 80.924 | |
| 5 | −385.292133909 | 24.003915576 | SIO2 | 81.802 | |
| 6 | −189.041850576 | 1.014246919 | AIR | 84.223 | |
| 7 | −1521.447544300 | 27.529894754 | SIO2 | 83.808 | |
| 8 | −150.691487200 | 0.999361796 | AIR | 85.384 | |
| 9 | 89.238407847 | 56.953687562 | SIO2 | 75.993 | |
| 10 | 101.329520927 | 13.713067990 | AIR | 58.085 | |
| 11 | 176.794820361 | 18.039991299 | SIO2 | 55.978 | |
| 12 | −447.950790449 | 73.129977874 | AIR | 52.127 | |
| 13 | −57.595257960 | 16.299538518 | SIO2 | 50.436 | |
| 14 | −83.036630542 | 0.999811850 | AIR | 64.360 | |
| 15 | −2287.430407510 | 44.210083628 | SIO2 | 86.772 | |
| 16 | −147.632600397 | 0.998596167 | AIR | 92.132 | |
| 17 | −352.966686998 | 32.886671205 | SIO2 | 97.464 | |
| 18 | −153.824954969 | 271.807415024 | AIR | 100.038 | |
| 19 | −238.525982305 | 14.998824247 | SIO2 | 122.669 | |
| 20 | −315.714610405 | 19.998064817 | AIR | 131.899 | |
| 21 | −202.650261219 | −19.998064817 | AIR | 131.917 | REFL |
| 22 | −315.714610405 | −14.998824247 | SIO2 | 131.852 | |
| 23 | −238.525982305 | −196.81118627 | AIR | 112.411 | |
| 24 | 207.441141965 | −14.998504935 | SIO2 | 107.771 | |
| 25 | 268.178120713 | −19.998469851 | AIR | 124.363 | |
| 26 | 193.196124575 | 19.998469851 | AIR | 127.679 | REFL |
| 27 | 268.178120713 | 14.998504935 | SIO2 | 125.948 | |
| 28 | 207.441141965 | 271.807924190 | AIR | 114.576 | |
| 29 | 325.701461380 | 38.709870586 | SIO2 | 92.964 | |
| 30 | −885.381927410 | 59.476563453 | AIR | 90.975 | |
| 31 | −123.867242183 | 18.110373017 | SIO2 | 74.226 | |
| 32 | 126.359054159 | 30.087671186 | AIR | 73.733 | |
| 33 | −16392.86524920 | 31.626040348 | SIO2 | 77.090 | |
| 34 | −299.592698534 | 15.292623049 | AIR | 86.158 | |
| 35 | −296.842399050 | 24.895495087 | SIO2 | 89.777 | |
| 36 | −163.748333285 | 8.131594074 | AIR | 94.529 | |
| 37 | 675.259743609 | 47.908987883 | SIO2 | 116.712 | |
| 38 | −263.915255162 | 1.054743285 | AIR | 118.641 | |
| 39 | 356.010681144 | 47.536295502 | SIO2 | 120.712 | |
| 40 | −435.299476405 | 3.543672029 | AIR | 119.727 | |
| 41 | ∞ | 10.346485925 | AIR | 112.597 | |
| 42 | 256.262375445 | 67.382487780 | SIO2 | 107.047 | |
| 43 | −454.037284452 | 0.998990981 | AIR | 99.451 | |
| 44 | 84.434680547 | 36.424585989 | SIO2 | 70.101 | |
| 45 | 207.490725651 | 0.997139930 | AIR | 62.005 | |
| 46 | 50.112836179 | 41.301883710 | CAFUV | 43.313 | |
| 47 | ∞ | 2.999011124 | H2OV | 20.878 | |
| 48 | ∞ | ∞ | AIR | 16.169 | |

TABLE 3

Aspherical Constants

| Surface | K | A | B | C | D | E | F |
|---|---|---|---|---|---|---|---|
| 6 | 0 | 5.47357338e−008 | 1.50925239e−012 | −1.14128005e−015 | 2.03745939e−022 | −1.46491288e−024 | 3.18476009e−028 |
| 7 | 0 | −5.65236098e−008 | −4.45251739e−012 | −1.12368170e−015 | 7.05334891e−020 | −6.42608755e−024 | 4.64154513e−029 |
| 12 | 0 | 3.75669258e−007 | 2.00493160e−011 | −1.57617930e−015 | 2.00775938e−018 | −1.81218495e−022 | 1.59512857e−028 |
| 16 | 0 | −2.97247128e−008 | −1.16246607e−013 | 1.91525676e−016 | −5.42330199e−021 | 4.84113906e−025 | −1.50564943e−030 |
| 19 | 0 | −1.79930163e−008 | −1.81456294e−014 | −6.42956161e−018 | −1.72138657e−022 | 4.34933124e−027 | −2.46030547e−031 |
| 23 | 0 | −1.79930163e−008 | −1.81456294e−014 | −6.42956161e−018 | −1.72138657e−022 | 4.34933124e−027 | −2.46030547e−031 |
| 24 | 0 | 1.41712563e−008 | 1.42766536e−013 | 5.35849443e−018 | 5.30493751e−022 | −2.04437497e−026 | 1.09297996e−030 |
| 28 | 0 | 1.41712563e−008 | 1.42766536e−013 | 5.35849443e−018 | 5.30493751e−022 | −2.04437497e−026 | 1.09297996e−030 |
| 29 | 0 | 1.42833387e−007 | 3.55808937e−014 | −1.23227147e−017 | 1.26320560e−021 | 1.99476309e−025 | −1.46884711e−029 |
| 31 | 0 | −1.51349602e−008 | 1.62092054e−011 | −4.43234287e−015 | 2.01248512e−019 | −3.73070267e−023 | 1.98749982e−027 |
| 34 | 0 | 1.39181850e−007 | 3.36145772e−012 | −4.99179521e−017 | −8.18195448e−021 | 4.05698527e−025 | 4.11589492e−029 |
| 42 | 0 | −4.24593271e−009 | −1.84016360e−012 | −2.09008867e−017 | −2.89704097e−021 | 1.96863338e−025 | 6.53807102e−030 |
| 43 | 0 | −1.75350671e−008 | 1.70435017e−014 | 1.85876255e−020 | 6.37197338e−021 | −5.19573140e−025 | 2.34597624e−029 |
| 45 | 0 | 4.03560215e−008 | 2.57831806e−011 | −6.32742355e−015 | 9.55984243e−019 | −1.13622236e−022 | 6.56644929e−027 |

TABLE 4

| | Wavelength | 193.368 nm | | |
|---|---|---|---|---|
| | $n_{SiO2}$ | 1.56078570 | | |
| | $n_{CAF2}$ | 1.50185255 | | |
| | $n_{H2O}$ | 1.43667693 | | |

| Surface | Radius [mm] | Thickness [mm] | Material | Type |
|---|---|---|---|---|
| 1 | ∞ | 24.835799 | AIR | |
| 2 | −135.814716 | 16.192962 | SIO2 | |
| 3 | −119.913542 | 49.259489 | AIR | |
| 4 | 190.208733 | 38.119892 | SIO2 | |
| 5 | 1900.935081 | 68.608703 | AIR | |
| 6 | 503.320133 | 22.740457 | SIO2 | |
| 7 | −466.557779 | 2.227725 | AIR | |
| 8 | 113.767280 | 48.364419 | SIO2 | |
| 9 | 1897.751748 | 21.970981 | AIR | |
| 10 | −1048.149230 | 14.997585 | SIO2 | |
| 11 | 328.654348 | 73.709249 | AIR | |
| 12 | −63.695002 | 15.006268 | SIO2 | |
| 13 | −70.535828 | 84.031867 | AIR | |
| 14 | −272.873878 | 34.322044 | SIO2 | |
| 15 | −134.672274 | 18.135135 | AIR | |
| 16 | 454.196139 | 26.813017 | SIO2 | |
| 17 | −566.904074 | 101.387523 | AIR | |
| 18 | ∞ | ∞ | AIR | |
| 19 | ∞ | 49.330059 | AIR | |
| 20 | 148.060628 | 38.658789 | SIO2 | |
| 21 | 941.677406 | 245.587303 | AIR | |
| 22 | −108.620347 | 15.378694 | SIO2 | |
| 23 | −268.635614 | 32.289153 | AIR | |
| 24 | −97.242002 | 15.110697 | SIO2 | |
| 25 | −404.755744 | 26.369650 | AIR | |

TABLE 4-continued

| Surface | Radius | Thickness | Material | Type |
|---|---|---|---|---|
| 26 | −149.887245 | ∞ | | REFL |
| 27 | ∞ | 26.369650 | | REFL |
| 28 | 404.755744 | 15.110697 | SIO2 | |
| 29 | 97.242002 | 32.289153 | AIR | |
| 30 | 268.635614 | 15.378694 | SIO2 | |
| 31 | 108.620347 | 245.587303 | AIR | |
| 32 | −941.677406 | 38.658789 | SIO2 | |
| 33 | −148.060628 | 52.067412 | AIR | |
| 34 | ∞ | ∞ | AIR | |
| 35 | ∞ | 93.863663 | AIR | |
| 36 | 156.839668 | 28.635685 | SIO2 | |
| 37 | 514.920638 | 224.426329 | AIR | |
| 38 | −123.664650 | 15.214354 | SIO2 | |
| 39 | 279.992726 | 37.187287 | AIR | |
| 40 | −8045.108721 | 31.359711 | SIO2 | |
| 41 | −302.089663 | 22.118779 | AIR | |
| 42 | −7299.382026 | 62.013089 | SIO2 | |
| 43 | −209.137445 | 12.058892 | AIR | |
| 44 | 303.603474 | 45.752430 | SIO2 | |
| 45 | −1658.733482 | 90.239284 | AIR | |
| 46 | ∞ | ∞ | AIR | |
| 47 | ∞ | −8.510360 | AIR | |
| 48 | 513.934846 | 39.643506 | SIO2 | |
| 49 | −642.206236 | 0.990358 | AIR | |
| 50 | 284.016280 | 32.142059 | SIO2 | |
| 51 | 2084.131044 | 0.988433 | AIR | |
| 52 | 129.947380 | 46.620068 | SIO2 | |
| 53 | 369.159447 | 1.062721 | AIR | |
| 54 | 58.093746 | 59.043156 | CAF2 | |
| 55 | ∞ | 4.000000 | H2O | |
| 56 | ∞ | ∞ | AIR | |

TABLE 5

Aspherical Constants

| Surface | 2 | 7 | 12 | 17 |
|---|---|---|---|---|
| K | 0 | 0 | 0 | 0 |
| A | −2.500529e−08 | 7.424963e−08 | −7.837140e−08 | −6.936751e−09 |
| B | 1.685929e−14 | 7.291227e−13 | −5.693329e−12 | 4.089006e−13 |
| C | −4.865536e−17 | 5.634783e−18 | −8.968210e−16 | −1.005205e−17 |
| D | 2.427204e−20 | 4.250130e−22 | −4.835784e−19 | 1.821265e−22 |
| E | −3.099456e−24 | 9.025109e−26 | 9.954830e−23 | 3.008630e−28 |
| F | 2.436987e−28 | 6.798162e−34 | −3.526037e−26 | −9.479346e−32 |

| Surface | 20 | 22 | 31 | 33 |
|---|---|---|---|---|
| K | 0 | 0 | 0 | 0 |
| A | −2.507746e−08 | 7.332013e−08 | −7.332013e−08 | 2.507746e−08 |
| B | −5.136109e−13 | 4.422225e−12 | −4.422225e−12 | 5.136109e−13 |
| C | −2.344922e−17 | 2.665006e−16 | −2.665006e−16 | 2.344922e−17 |
| D | −1.402523e−21 | 5.801637e−20 | −5.801637e−20 | 1.402523e−21 |
| E | 5.591505e−26 | −8.129567e−24 | 8.129567e−24 | −5.591505e−26 |
| F | −5.072383e−30 | 1.385124e−27 | −1.385124e−27 | 5.072383e−30 |

| Surface | 37 | 38 | 40 | 45 | 53 |
|---|---|---|---|---|---|
| K | 0 | 0 | 0 | 0 | 0 |
| A | 1.538328e−08 | −5.142285e−08 | −1.596718e−08 | 2.155484e−08 | 3.135762e−09 |
| B | 2.186161e−13 | 2.117680e−12 | −8.831439e−13 | −1.005282e−13 | 4.048906e−12 |
| C | −2.363126e−17 | −4.268226e−18 | 1.611148e−17 | −5.260485e−19 | −3.987913e−16 |
| D | 1.756064e−21 | 1.280625e−20 | −1.859647e−21 | 3.313318e−23 | 4.007326e−20 |
| E | −9.556952e−26 | −1.688723e−24 | 1.003221e−25 | 4.668316e−29 | −2.359111e−24 |
| F | 2.632197e−30 | 1.851050e−28 | −5.689506e−30 | −3.312827e−33 | 7.644537e−29 |

TABLE 7

| | Wavelength | 193.368 nm | | |
|---|---|---|---|---|
| | $n_{SiO2}$ | 1.56078570 | | |
| | $n_{CAF2}$ | 1.50185255 | | |
| | $n_{H2O}$ | 1.43667693 | | |

| Surface | Radius [mm] | Thickness [mm] | Material | Type |
|---|---|---|---|---|
| 1 | ∞ | 24.835799 | AIR | |
| 2 | −134.513233 | 16.599052 | SIO2 | |
| 3 | −117.196017 | 48.290946 | AIR | |
| 4 | 188.589199 | 38.035326 | SIO2 | |
| 5 | 1745.167499 | 68.910797 | AIR | |
| 6 | 597.625603 | 22.936977 | SIO2 | |
| 7 | −492.429244 | 2.998743 | AIR | |
| 8 | 112.265513 | 49.028672 | SIO2 | |
| 9 | 1816.760477 | 22.546547 | AIR | |
| 10 | −725.371776 | 15.331146 | SIO2 | |
| 11 | 459.056437 | 74.032302 | AIR | |
| 12 | −63.715705 | 15.008299 | SIO2 | |
| 13 | −70.140710 | 83.450787 | AIR | |
| 14 | −268.779722 | 33.997402 | SIO2 | |
| 15 | −137.237523 | 16.828132 | AIR | |
| 16 | 476.388788 | 26.785828 | SIO2 | |
| 17 | −526.314497 | 103.862567 | AIR | |
| 18 | ∞ | ∞ | AIR | |
| 19 | ∞ | 48.992776 | AIR | |
| 20 | 148.884446 | 38.369155 | SIO2 | |
| 21 | 1028.312683 | 245.424399 | AIR | |
| 22 | −108.322432 | 15.419632 | CAF2 | |
| 23 | −287.298737 | 32.357524 | AIR | |
| 24 | −93.933143 | 15.045092 | SIO2 | |
| 25 | −392.938180 | 26.363744 | AIR | |
| 26 | −149.508574 | ∞ | | REFL |
| 27 | ∞ | 26.363744 | | REFL |
| 28 | 392.938180 | 15.045092 | SIO2 | |
| 29 | 93.933143 | 32.357524 | AIR | |
| 30 | 287.298737 | 15.419632 | CAF2 | |
| 31 | 108.322432 | 245.424399 | AIR | |
| 32 | −1028.312683 | 38.369155 | SIO2 | |
| 33 | −148.884446 | 59.350172 | AIR | |
| 34 | ∞ | ∞ | AIR | |
| 35 | ∞ | 94.081966 | AIR | |
| 36 | 154.585489 | 28.838533 | SIO2 | |
| 37 | 477.820480 | 224.606203 | AIR | |
| 38 | −120.928245 | 15.275911 | SIO2 | |
| 39 | 283.835098 | 37.200816 | AIR | |
| 40 | −10932.227644 | 31.368826 | SIO2 | |
| 41 | −301.653747 | 22.139294 | AIR | |
| 42 | −9104.872172 | 62.074317 | SIO2 | |
| 43 | −207.593117 | 10.117084 | AIR | |
| 44 | 301.316891 | 45.864656 | SIO2 | |
| 45 | −1633.284546 | 89.921464 | AIR | |
| 46 | ∞ | ∞ | AIR | |
| 47 | ∞ | −9.613093 | AIR | |
| 48 | 488.946113 | 39.899906 | SIO2 | |
| 49 | −690.442073 | 0.940902 | AIR | |
| 50 | 288.699768 | 31.883917 | SIO2 | |
| 51 | 2094.352136 | 0.921072 | AIR | |
| 52 | 125.841862 | 46.534401 | CAF2 | |
| 53 | 419.130079 | 0.954510 | AIR | |
| 54 | 57.805458 | 59.030685 | CAF2 | |
| 55 | ∞ | 4.000000 | H2O | |
| 56 | ∞ | ∞ | AIR | |

TABLE 8

Aspherical Constants

| Surface | 2 | 7 | 12 | 17 |
|---|---|---|---|---|
| K | 0 | 0 | 0 | 0 |
| A | −2.836619e−08 | 7.314614e−08 | −6.848302e−08 | −7.182535e−09 |
| B | −2.794060e−13 | 7.867558e−13 | −3.634075e−12 | 4.147635e−13 |
| C | −9.783217e−17 | −3.795564e−18 | −9.164181e−16 | −1.028412e−17 |
| D | 2.969465e−20 | 1.773342e−21 | 5.465612e−21 | 1.809649e−22 |
| E | −3.992239e−24 | 2.186206e−26 | −5.681228e−23 | 2.125361e−27 |
| F | 2.844283e−28 | −1.093488e−31 | 4.971519e−27 | −2.313653e−31 |

| Surface | 20 | 22 | 31 | 33 |
|---|---|---|---|---|
| K | 0 | 0 | 0 | 0 |
| A | −2.510219e−08 | 7.765433e−08 | −7.765433e−08 | 2.510219e−08 |
| B | −4.992791e−13 | 5.173403e−12 | −5.173403e−12 | 4.992791e−13 |
| C | −2.197862e−17 | 2.731061e−16 | −2.731061e−16 | 2.197862e−17 |
| D | −1.441527e−21 | 9.933978e−20 | −9.933978e−20 | 1.441527e−21 |
| E | 6.108197e−26 | −1.644517e−23 | 1.644517e−23 | −6.108197e−26 |
| F | −5.001323e−30 | 2.360870e−27 | −2.360870e−27 | 5.001323e−30 |

| Surface | 37 | 38 | 40 | 45 | 53 |
|---|---|---|---|---|---|
| K | 0 | 0 | 0 | 0 | 0 |
| A | 1.539382e−08 | −4.703385e−08 | −1.805328e−08 | 2.127401e−08 | 8.317220e−09 |
| B | 2.610877e−13 | 2.037588e−12 | −8.134633e−13 | −1.186329e−13 | 4.289210e−12 |
| C | −2.546236e−17 | −6.241672e−19 | 1.727841e−17 | −4.304496e−20 | −4.521160e−16 |
| D | 2.167469e−21 | 2.970890e−21 | −2.082794e−21 | 2.210684e−23 | 4.668240e−20 |
| E | −1.302346e−25 | 3.100205e−25 | 1.168901e−25 | 2.070099e−28 | −2.718326e−24 |
| F | 3.661636e−30 | 3.792839e−29 | −6.027951e−30 | −4.209602e−33 | 8.727990e−29 |

TABLE 9

| | Wavelength | 193.368 nm | | |
|---|---|---|---|---|
| | $n_{SiO2}$ | 1.56078570 | | |
| | $n_{CAF2}$ | 1.50185255 | | |
| | $n_{H2O}$ | 1.43667693 | | |

| Surface | Radius [mm] | Thickness [mm] | Material | Type |
|---|---|---|---|---|
| 1 | ∞ | 24.835799 | AIR | |
| 2 | −134.722052 | 16.632099 | SIO2 | |
| 3 | −116.984731 | 48.064359 | AIR | |
| 4 | 188.559470 | 37.784104 | SIO2 | |
| 5 | 1681.053597 | 69.086433 | AIR | |
| 6 | 585.271827 | 22.981685 | SIO2 | |
| 7 | −482.280748 | 3.137545 | AIR | |
| 8 | 112.921777 | 48.971482 | SIO2 | |
| 9 | 2017.889025 | 22.568788 | AIR | |
| 10 | −712.391053 | 15.284212 | SIO2 | |
| 11 | 446.567783 | 74.046551 | AIR | |
| 12 | −63.528301 | 15.009746 | SIO2 | |
| 13 | −70.130703 | 83.406497 | AIR | |
| 14 | −268.253379 | 33.893943 | SIO2 | |
| 15 | −137.475882 | 16.321528 | AIR | |
| 16 | 475.987417 | 26.789194 | SIO2 | |
| 17 | −526.485865 | 105.088101 | AIR | |
| 18 | ∞ | ∞ | AIR | |
| 19 | ∞ | 49.556240 | AIR | |
| 20 | 148.917387 | 38.384151 | SIO2 | |
| 21 | 1026.899251 | 245.450171 | AIR | |
| 22 | −107.868363 | 15.472265 | CAF2 | |
| 23 | −285.610735 | 32.397933 | AIR | |
| 24 | −94.148346 | 15.043260 | SIO2 | |
| 25 | −398.707964 | 26.353779 | AIR | |
| 26 | −149.416283 | ∞ | | REFL |
| 27 | ∞ | 26.353779 | | REFL |
| 28 | 398.707964 | 15.043260 | SIO2 | |
| 29 | 94.148346 | 32.397933 | AIR | |
| 30 | 285.610735 | 15.472265 | CAF2 | |
| 31 | 107.868363 | 245.450171 | AIR | |
| 32 | −1026.899251 | 38.384151 | SIO2 | |
| 33 | −148.917387 | 60.621748 | AIR | |
| 34 | ∞ | ∞ | AIR | |
| 35 | ∞ | 94.095389 | AIR | |
| 36 | 155.152388 | 28.642967 | SIO2 | |
| 37 | 492.854213 | 224.630079 | AIR | |
| 38 | −122.837274 | 15.289150 | SIO2 | |
| 39 | 279.512640 | 37.203288 | AIR | |
| 40 | 88641.825999 | 31.368269 | CAF2 | |
| 41 | −294.693834 | 22.131427 | AIR | |
| 42 | −9869.784817 | 62.096368 | SIO2 | |
| 43 | −206.877800 | 9.358336 | AIR | |
| 44 | 299.626922 | 46.310125 | SIO2 | |
| 45 | −1585.712819 | 89.985347 | AIR | |
| 46 | ∞ | ∞ | AIR | |
| 47 | ∞ | −9.788190 | AIR | |
| 48 | 485.199520 | 40.022092 | SIO2 | |
| 49 | −694.632202 | 0.977090 | AIR | |
| 50 | 288.740026 | 31.884256 | SIO2 | |
| 51 | 2101.280023 | 0.948615 | AIR | |
| 52 | 125.392656 | 46.527848 | CAF2 | |
| 53 | 414.471768 | 0.952859 | AIR | |
| 54 | 57.730652 | 59.030494 | CAF2 | |
| 55 | ∞ | 4.000000 | H2O | |
| 56 | ∞ | ∞ | AIR | |

TABLE 10

Aspherical Constants

| Surface | 2 | 7 | 12 | 17 |
|---|---|---|---|---|
| K | 0 | 0 | 0 | 0 |
| A | −3.034793e−08 | 7.228314e−08 | −6.657601e−08 | −7.213386e−09 |
| B | −4.022984e−13 | 7.576360e−13 | −3.356152e−12 | 4.144362e−13 |
| C | −9.079487e−17 | −3.360346e−18 | −7.441221e−16 | −9.954779e−18 |
| D | 2.548798e−20 | 1.774159e−21 | 5.674385e−21 | 1.480046e−22 |
| E | −3.510869e−24 | 1.501196e−26 | −5.267408e−23 | 2.830347e−27 |
| F | 2.538506e−28 | 2.558270e−32 | 8.568202e−27 | −2.026497e−31 |

| Surface | 20 | 22 | 31 | 33 |
|---|---|---|---|---|
| K | 0 | 0 | 0 | 0 |
| A | −2.511892e−08 | 7.897459e−08 | −7.897459e−08 | 2.511892e−08 |
| B | −4.980560e−13 | 5.255927e−12 | −5.255927e−12 | 4.980560e−13 |
| C | −2.179091e−17 | 2.855820e−16 | −2.855820e−16 | 2.179091e−17 |
| D | −1.427736e−21 | 9.594510e−20 | −9.594510e−20 | 1.427736e−21 |
| E | 5.811126e−26 | −1.566845e−23 | 1.566845e−23 | −5.811126e−26 |
| F | −4.849840e−30 | 2.330201e−27 | −2.330201e−27 | 4.849840e−30 |

| Surface | 37 | 38 | 40 | 45 | 53 |
|---|---|---|---|---|---|
| K | 0 | 0 | 0 | 0 | 1.097312e−08 |
| A | 1.505446e−08 | −5.409096e−08 | −1.849187e−08 | 2.120564e−08 | 4.076186e−12 |
| B | 2.608129e−13 | 1.776416e−12 | −9.199664e−13 | −1.058854e−13 | −4.167092e−16 |
| C | −2.368757e−17 | −3.294157e−20 | 1.876356e−17 | −3.606157e−19 | 4.368319e−20 |
| D | 1.893750e−21 | −4.680360e−22 | −1.973877e−21 | 2.646607e−23 | −2.540365e−24 |
| E | −1.124065e−25 | 7.056723e−25 | 9.944804e−26 | 2.111671e−28 | 8.483638e−29 |
| F | 3.211192e−30 | 3.873814e−29 | −5.629129e−30 | −4.581864e−33 | 1.097312e−08 |

The invention claimed is:

1. A method of determining materials of lenses contained in an optical system of a projection exposure apparatus, said method comprising the following steps:
   a) determining, for each lens of a plurality of the lenses, a susceptibility factor $K_{LT/LH}$ that is a measure of the susceptibility of the respective lens to deteriorations caused by at least one of lifetime effects and lens heating effects;
   b) selecting a birefringent fluoride crystal as a material for each lens for which the susceptibility factor $K_{LT/LH}$ is above a predetermined threshold;
   c) defining a first set of lenses comprising only lenses for which the susceptibility factor $K_{LT/LH}$ is above a predetermined threshold;
   d) determining measures for reducing adverse effects caused by birefringence inherent to the lenses of the first set of lenses.

2. The method of claim 1, wherein the susceptibility factor $K_{LT/LH}$ of a lens depends on its thickness D along an axis of rotational symmetry and on its clear aperture CA.

3. The method of claim 2, wherein the susceptibility factor $K_{LT/LH}$ is given by $$K_{LT/LH} = D/<D> * (<CA>/CA)^2,$$

wherein <D> is the mean value of the thickness D of the plurality of lenses and <CA> is the mean value of the clear aperture CA of the plurality of lenses.

4. The method of claim 1, wherein the measures of step d) includes the selection of particular fluoride crystal materials.

5. The method of claim 4, wherein the selection is made from the group consisting of $CaF_2$, $BaF_2$, $SrF_2$, $LiF_2$ and $Ca_{1-x}Ba_xF_2$.

6. The method of claim 1, wherein the measures of step d) include the determination of crystal lattice orientations.

7. The method of claim 6, wherein the measures of step d) include the determination of relative angular positions that are the result of rotations of crystal lattices around an optical axis of the optical system.

8. The method of claim 7, wherein the relative angular positions are determined such that a combination of crystals causes a birefringence distribution that is at least substantially rotationally symmetric.

9. The method of claim 8, wherein the relative angular positions are determined such that a mutual compensation of birefringence is achieved.

10. The method of claim 8, wherein the measures of step d) include the steps of:
   conceptionally splitting a lens of the first set of lenses into at least two lens elements;
   fabricating the at least two lens elements;
   combining and contacting the at least two lens elements with different crystal lattice orientation.

11. The method of claim 10, wherein the at least two lens elements are fabricated by splitting up a single lens blank.

12. The method of claim 10, wherein the lens that is conceptionally split up is the last optical element in the optical system having a non-zero optical power.

13. The method of claim 12, wherein the last optical element is split up into a first lens part having a convex and a plane surface and a second lens part having two plane surfaces, and wherein the ratio $D_1/D_2$ of the center thickness $D_1$ of the first lens part and the center thickness $D_2$ of the second lens deviates not more than 30% from the value $$\frac{2D}{L\cos\alpha_m} - 1$$

with $$D = D_1 + D_2$$

$$L = -(R-D)\cos\alpha_m - l\sin\alpha_m + \sqrt{[(R-D)\cos\alpha_m + l\sin\alpha_m]^2 + R^2 - (R-D)^2 - l^2}$$

$$l = D_w \frac{n_m \sin\alpha_m}{\sqrt{n_a^2 - n_m^2 \sin^2\alpha_m}},$$

wherein $\alpha_m$ is the aperture angle for which maximum birefringence occurs, $n_m$ is the refractive index of the lens parts, $n_a$ is the refractive index of an optical medium between the second lens part and a field plane, R is the radius of the convex surface of the first lens part, and $D_W$ is the distance between the second lens part and the field plane.

14. The method of claim 13, wherein the ratio $D_1/D_2$ deviates not more than 20%, preferably not more than 10%, is from said value.

15. The method of claim 6, wherein the measures of step d) include the step of tilting a crystal axis with respect to an optical axis of the optical system so that a predefined tilting angle having an absolute value between 1° and 40° is formed between the crystal axis and the optical axis.

16. The method of claim 15, wherein the absolute value of the tilting angle is between 5° and 20°.

17. The method of claim 1, wherein only those lenses are assigned to the first set of lenses that are susceptible to cause birefringence.

18. The method of claim 17, wherein only those lenses are assigned to the first set of lenses that have a geometrical factor $K^g_{IB}$ exceeding a predetermined threshold value, said geometrical factor $K^g_{IB}$ being a measure of the susceptibility of a lens to cause birefringence.

19. The method of claim 1, wherein the step d) comprises the further step d1) of determining whether it is possible to confine the measures to the lenses of the first set of lenses.

20. The method of claim 19, wherein the determination of step d1) comprises the further step d1a) of defining groups of lenses that are contained in the first set of lenses and whose crystal lattice orientations can be arranged such the birefringence distribution is at least substantially rotationally symmetrical.

21. The method of claim 20, wherein the step d1a) comprises the step d1a1) of determining a geometrical factor $K^g_{IB}$ for a plurality of points distributed over a pupil of a specific lens, said geometrical factor $K^g_{IB}$ being a measure of the susceptibility of a lens to cause birefringence for a light ray traversing a respective point.

22. The method of claim 21, wherein the geometrical factor $K^g_{IB}$ is solely a function of the angle $\alpha_R$ of the ray with respect to the optical axis and of the optical path length L of the ray within the lens.

23. The method of claim 22, wherein the geometrical factor $K^g_{IB}$ is given by $$K^g_{IB} = L \sin^2 \alpha_R (7 \cos^2 \alpha_R - 1).$$

24. The method of claim 23, wherein the determination according to step d1a1) comprises the step d1a1a) of selecting lenses of the first set of lenses that
   have Zernike coefficients that differ by not more than a predetermined amount and for which $K^g_{IB}$ is substantially equals zero in the center of the pupil.

25. The method of claim 21, wherein the determination according to step d1a1) comprises the step d1a1a) of expanding a distribution of the geometrical factor $K^g_{IB}$ across the pupil into a Zernike polynominal that is characterized by Zernike coefficients.

26. The method of claim 25, wherein the step d1a) comprises the step d1a1b) of selecting lenses for which a weighed sum of Zernike coefficients does not exceed a predetermined value.

27. The method of claim 26, wherein the weighed sum is given by $$\sum_{all\ lenses} M^{(i)} q^{(i)} Z_n^{(i)} \leq Z_{th},$$

wherein $M^{(i)}$ is a material factor of a lens i, $q^{(i)}$ is a orientation factor of a lens i, $Z_n^{(i)}$ is the n-th Zernike coefficient of the $K^g_{IB}$ expansion of a lens i, and $Z_{th}$ is a predetermined threshold value.

28. The method of claim 19, wherein lenses of each group of lenses have the same or equivalent crystal axes aligned along an optical axis of the optical system.

29. The method of claim 19, wherein the step d) comprises the further step d2) of determining measures that relate also to lenses that do not belong to the first set of lenses in the case that the determination according to step d1) has a negative result.

30. The method of claim 29, wherein the step d2) comprises the further step d2a) of selecting a second set of lenses containing lenses that do not belong to the first set of lenses.

31. The method of claim 30, wherein only those lenses are assigned to the second set of lenses that have a geometrical factor $K^g_{IB}$ exceeding a predetermined threshold value, said geometrical factor $K^g_{IB}$ being a measure of the susceptibility of a lens to cause birefringence.

32. An optical system of a projection exposure apparatus having lenses made of lens materials that are determined according to the method of claim 1.

33. A method of determining materials of lenses contained in an optical system of a projection exposure apparatus, said method comprising the following steps:
a) determining, for each lens of a plurality of the lenses, a susceptibility factor $K_{LT/LH}$ that is a measure of the susceptibility of the respective lens to deteriorations caused by at least one of lifetime effects and lens heating effects;
b) providing a predetermined quantity of fluoride crystals;
c) sorting the lenses in the order of the susceptibility factor $K_{LT/LH}$;
d) selecting a birefringent fluoride crystal as a material for k lenses having the highest susceptibility factor $K_{LT/LH}$, wherein k is selected such that for a lens k+1, which follows the lens k in the order of the susceptibility factor, the remaining quantity of fluoride crystals is not sufficient;
e) defining a first set of lenses comprising the k lenses;
f) determining measures for reducing adverse effects caused by birefringence inherent to the lenses of the first set of lenses.

34. The method of claim 33, wherein the susceptibility factor $K_{LT/LH}$ of a lens depends on its thickness D along an axis of rotational symmetry and on its clear aperture CA.

35. The method of claim 34, wherein the susceptibility factor $K_{LT/LH}$ is given by $$K_{LT/LH} = D/<D>*(<CA>/CA)^2,$$

wherein $<D>$ is the mean value of the thickness D of the plurality of lenses and $<CA>$ is the mean value of the clear aperture CA of the plurality of lenses.

36. An optical system of a projection exposure apparatus, comprising at least one lens made of a non-crystalline material, wherein all lenses having a susceptibility factor $K_{LT/LH} > 1$ are made of a birefringent crystal, with $K_{LT/LH}$ being given by $$K_{LT/LH} = D/<D>*(<CA>/CA)^2,$$

$<D>$ being the mean value of the thickness D of the plurality of lenses and $<CA>$ being the mean value of the clear aperture CA of all lenses of the optical system.

37. The optical system of claim 36, wherein the crystals have crystal lattice orientations that are determined such a mutual compensation of intrinsic birefringence is achieved.

38. The optical system of claim 36, wherein the crystals have crystal lattice orientations that are determined such an at least substantially rotationally symmetrical birefringence distribution is achieved.

39. The optical system of claim 36, comprising at least one further lens being made of a crystal and having a susceptibility factor $K_{LT/LH} < 1$, wherein the at least one further lens has a crystal lattice orientation that is determined such the intrinsic birefringence of the overall optical system is reduced.

40. The optical system of claim 36, comprising at least one further lens being made of a crystal and having a susceptibility factor $K_{LT/LH} < 1$, wherein the at least one further lens has a crystal lattice orientation that is determined such the intrinsic birefringence distribution of the overall optical system becomes more rotationally symmetrical.

41. The optical system claim 36, comprising at least one further lens being made of a crystal and having a susceptibility factor $K_{LT/LH} < 1.3$, wherein the at least one further lens has a crystal lattice orientation that is determined such the intrinsic birefringence of the overall optical system is reduced.

42. The optical system of claim 36, comprising at least one further lens being made of a crystal and having a susceptibility factor $K_{LT/LH} < 1.3$, wherein the at least one further lens has a crystal lattice orientation that is determined such the intrinsic birefringence distribution of the overall optical system becomes more rotationally symmetrical.

43. The optical system of claim 36, comprising at least one further lens being made of a crystal and having a susceptibility factor $K_{LT/LH} < 3$, wherein the at least one further lens has a crystal lattice orientation that is determined such the intrinsic birefringence of the overall optical system is reduced.

44. The optical system of claim 36, comprising at least one further lens being made of a crystal and having a susceptibility factor $K_{LT/LH} < 3$, wherein the at least one further lens has a crystal lattice orientation that is determined such the intrinsic birefringence distribution of the overall optical system becomes more rotationally symmetrical.

45. The optical system of claim 36, comprising at least one further lens being made of a crystal and having a susceptibility factor $K_{LT/LH} < 5$, wherein the at least one further lens has a crystal lattice orientation that is determined such the intrinsic birefringence of the overall optical system is reduced.

46. The optical system of claim 36, comprising at least one further lens being made of a crystal and having a susceptibility factor $K_{LT/LH}$<5, wherein the at least one further lens has a crystal lattice orientation that is determined such the intrinsic birefringence distribution of the overall optical system becomes more rotationally symmetrical.

47. An optical system of a projection exposure apparatus, comprising at least 3 lenses that are made of a non-crystalline material and at least 3 lenses that are made of a birefringent crystal, wherein all lenses made of a birefringent crystal have a higher susceptibility factor $K_{LT/LH}$ than the lenses made of a non-crystalline material, wherein $K_{LT/LH}$ is given by $$K_{LT/LH}=D/<D>*(<CA>/CA)^2,$$

with <D> being the mean value of the thickness D of the plurality of lenses and <CA> being the mean value of the clear aperture CA of all lenses of the optical system.

48. An optical system of a projection exposure apparatus, comprising at least 5 lenses that are made of a non-crystalline material and at least 5 lenses that are made of a birefringent crystal, wherein all lenses made of a birefringent crystal have a higher susceptibility factor $K_{LT/LH}$ than the lenses made of a non-crystalline material, wherein $K_{LT/LH}$ is given by $$K_{LT/LH}=D/<D>*(<CA>/CA)^2,$$

with <D> being the mean value of the thickness D of the plurality of lenses and <CA> being the mean value of the clear aperture CA of all lenses of the optical system.

* * * * *